United States Patent [19]
Moslehi et al.

[11] Patent Number: 5,937,142
[45] Date of Patent: Aug. 10, 1999

[54] MULTI-ZONE ILLUMINATOR FOR RAPID THERMAL PROCESSING

[75] Inventors: Mehrdad M. Moslehi, Los Altos; Yong Jin Lee, San Jose; Ahmad Kermani, Danville, all of Calif.; William J. Messner, W. Henrietta, N.Y.

[73] Assignee: CVC Products, Inc.

[21] Appl. No.: 08/678,321

[22] Filed: Jul. 11, 1996

[51] Int. Cl.⁶ .............................. A21B 2/00; C23C 16/00
[52] U.S. Cl. ........................ 392/416; 392/418; 392/422; 118/725
[58] Field of Search ..................... 392/416, 418, 392/422, 425, 427, 411; 219/405, 411, 390, 412; 118/724, 725

[56] References Cited

U.S. PATENT DOCUMENTS

| | | | |
|---|---|---|---|
| 3,761,678 | 9/1973 | Eckles | 219/416 |
| 4,640,224 | 2/1987 | Bunch et al. | 118/725 |
| 4,649,261 | 3/1987 | Sheetz | 219/390 |
| 4,752,592 | 6/1988 | Tamura et al. | 437/247 |
| 4,796,562 | 1/1989 | Brors et al. | 118/725 |
| 4,891,499 | 1/1990 | Moslehi | 219/502 |
| 4,956,538 | 9/1990 | Moslehi | 219/121.6 |
| 5,156,461 | 10/1992 | Moslehi et al. | 374/121 |
| 5,179,677 | 1/1993 | Anderson et al. | 392/411 |
| 5,228,114 | 7/1993 | Suzuki | 392/416 |
| 5,255,286 | 10/1993 | Moslehi et al. | 374/121 |
| 5,268,989 | 12/1993 | Moslehi et al. | 392/418 |
| 5,305,417 | 4/1994 | Najm | 392/418 |
| 5,308,161 | 5/1994 | Stein | 374/5 |
| 5,317,656 | 5/1994 | Moslehi et al. | 385/12 |
| 5,367,606 | 11/1994 | Moslehi et al. | 392/418 |
| 5,436,172 | 7/1995 | Moslehi | 437/8 |
| 5,443,315 | 8/1995 | Lee et al. | 374/126 |
| 5,444,815 | 8/1995 | Lee | 392/416 |
| 5,445,677 | 8/1995 | Kawata et al. | 118/724 |
| 5,446,825 | 8/1995 | Moslehi | 392/416 |
| 5,467,220 | 11/1995 | Xu | 219/405 |
| 5,480,489 | 1/1996 | Hawegawa et al. | 118/725 |
| 5,487,127 | 1/1996 | Gronet | 392/416 |
| 5,551,985 | 9/1996 | Brors | 118/725 |
| 5,603,772 | 2/1997 | Ide | 219/390 |

Primary Examiner—Teresa Walberg
Assistant Examiner—Daniel L. Robinson
Attorney, Agent, or Firm—Gray Cary Ware & Freidenrich

[57] ABSTRACT

A system for rapid thermal processing of a substrate in a process chamber while measuring and controlling the temperature at the substrate to establish substantially uniform substrate temperature in real time. The system includes an axisymmetrical multi-zone illuminator having a plurality of substantially concentric rings of heating lamps to direct optical power toward said substrate, a fluid cooled optical reflector facing the substrate frontside and having a relatively high optical reflectivity. The system also includes a multizone temperature measurement system having a plurality of pyrometry sensors coupled to said multi-zone illuminator, a system for real-time measurement and compensation of substrate emissivity and illuminator lamp light interference effects, and a multi-variable temperature controller for providing multi-zone real-time temperature control. The system also incorpotates a plurality of illuminator lamp power supplies.

17 Claims, 14 Drawing Sheets

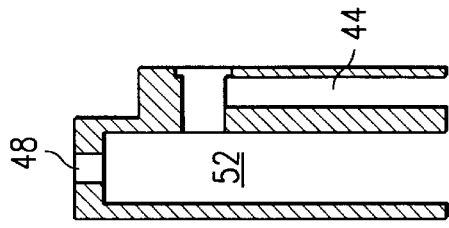
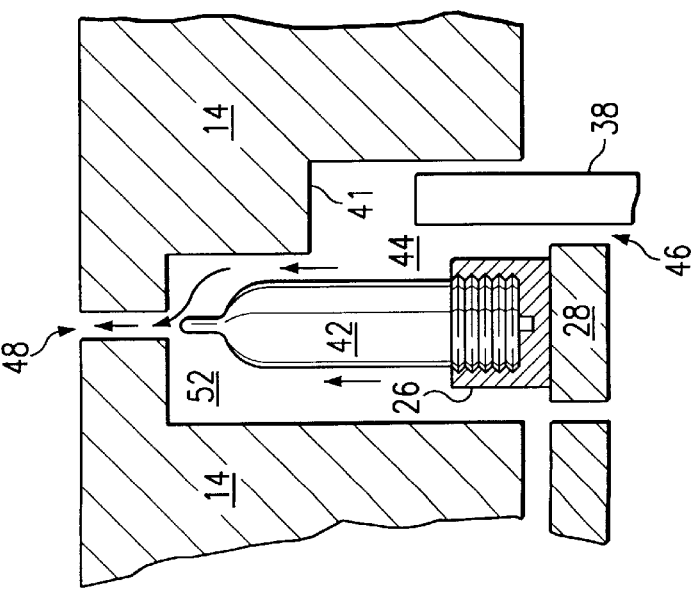
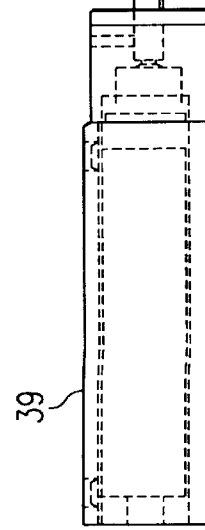

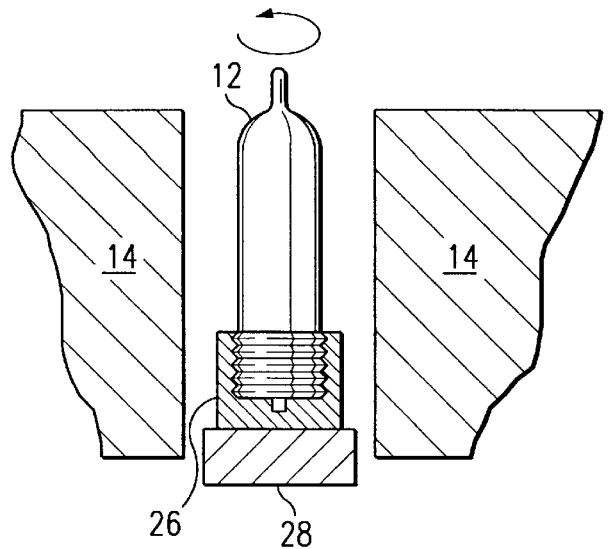
FIG. 8
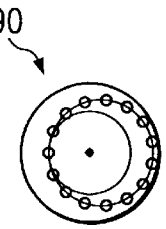
FIG. 9
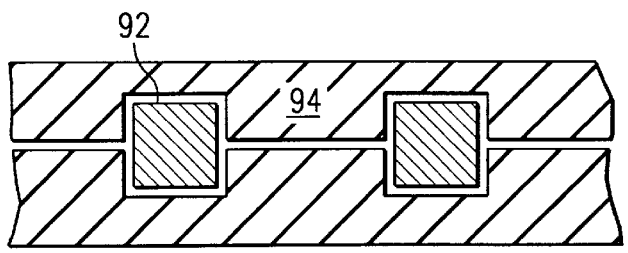
FIG. 10
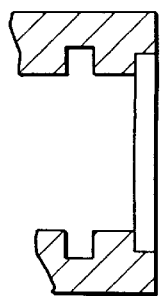   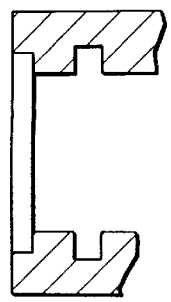   
FIG. 11                FIG. 12

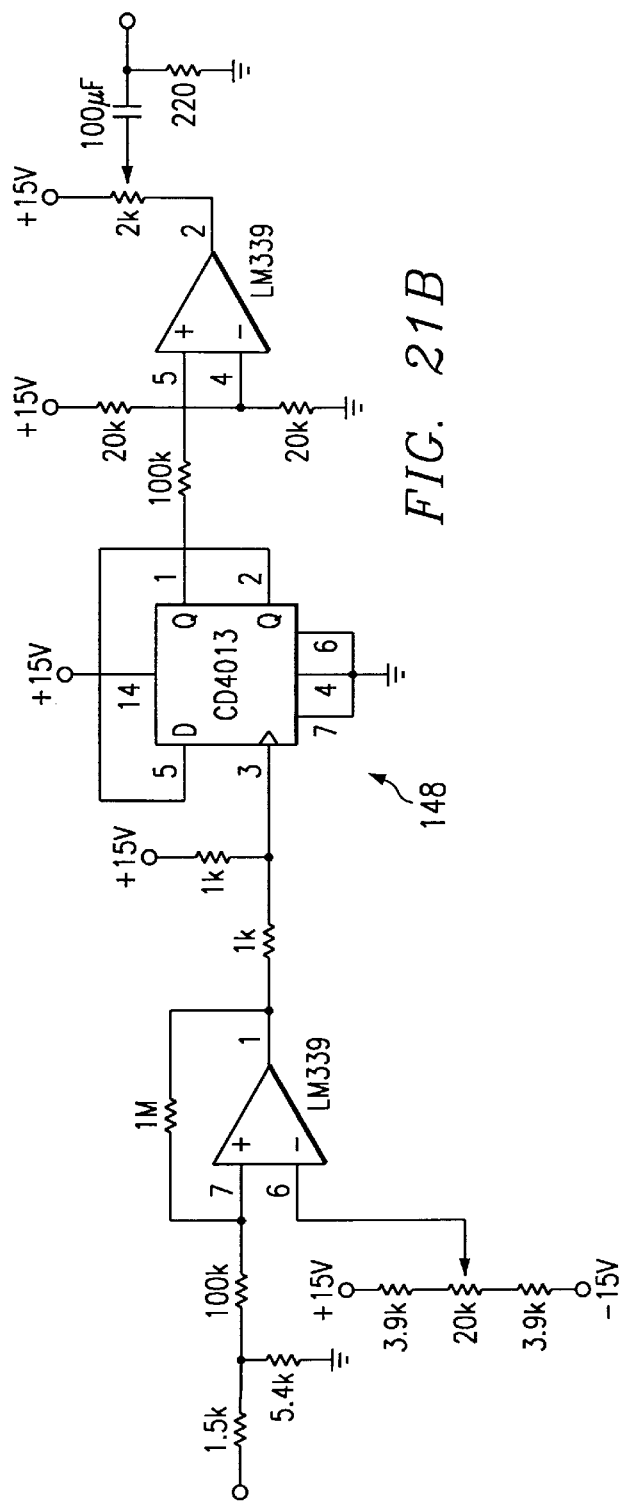
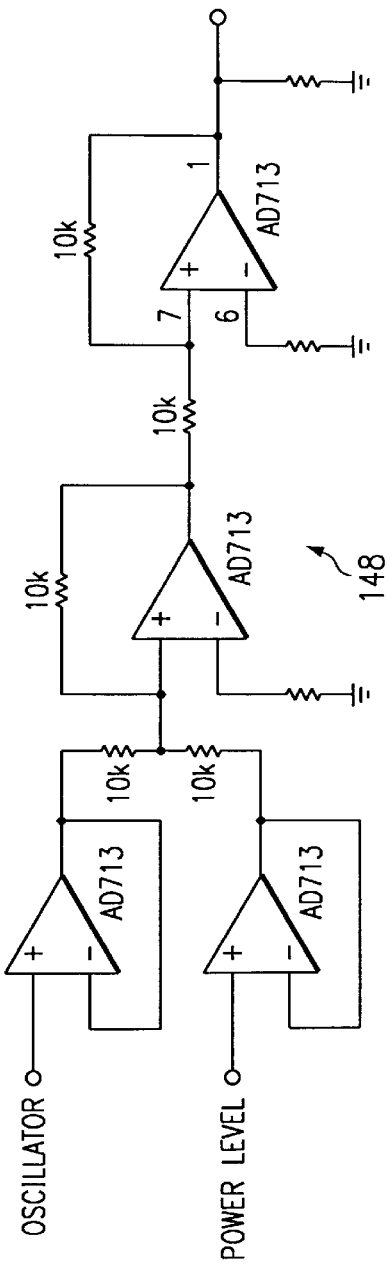
FIG. 21B
FIG. 21C

MULTI-ZONE ILLUMINATOR FOR RAPID THERMAL PROCESSING

BACKGROUND OF THE INVENTION

Single-wafer rapid thermal processing (RTP) of semiconductors provides a powerful and versatile technique for fabrication of very-large-scale-integrated (VLSI) and ultra-large-scale-integrated (ULSI) electronic devices. RTP combines low thermal mass photon-assisted rapid wafer heating with inert or reactive ambient semiconductor wafer processing.

Rapid thermal processing (RTP) of semiconductor wafers provides a capability for improved wafer-to-wafer process repeatability in a single-wafer lamp-heated thermal processing reactor. RTP systems mostly employ illuminators consisting of an array of tungsten halogen lamps to heat a semiconductor wafer either directly or through a graphite susceptor in a cold-wall process chamber. Conventional RTP systems typically employ illuminators that provide single-zone or very limited asymmetrical multi-zone control capability. Thus, an increase or decrease of power to the illuminator affects the entire wafer temperature distribution and uniformity. In general, the existing commercial RTP systems in the market can be divided into the following four categories:

(1) Top and bottom wafer heating using two arrays of linear tungsten halogen lamps. This type of RTP system configuration has traditionally dominated in the market (offered by RTP vendors such as AG Associates of U.S.A., AST of Germany; and DaiNippon Screen of Japan). In this configuration, the wafer (typically a semiconductor wafer) is placed in an atmospheric quartz chamber and is heated from both frontside and backside by two arrays of linear tungsten halogen lamps. As a result, these systems employ non-axisymmetrical illuminators, usually to heat a stationary (non-rotating) wafer. These systems lack the essential requirements such as multi-point sensors and energy source (illuminator) axisymmetry for effective wafer temperature uniformity and repeatability control. While these RTP systems can be used for anneal (RTA or Rapid Thermal Anneal) and oxidation (RTO or Rapid Thermal Oxidation) processes, they cannot be used for Rapid Thermal Chemical-Vapor Deposition (RTCVD) applications. In addition to the temperature uniformity and repeatability problems, these RTP system designs also suffer from localized temperature and process non-uniformities due to device or chip pattern effects. The device patterns on the wafer frontside (produced by the deposition, micro lithography, and etch steps) produce different total and spectral emissivities on the wafer frontside. The regions with varying frontside emissivities (and absorptivities) absorb different amounts of photon energy or light flux from the radiative tungsten halogen lamps, resulting in different thermal responses. Moreover, the wafer frontside region with different device pattern-induced emissivities will dissipate different amounts of energy by optical radiation. This is due to the fact that the amount of radiative power loss P per unit area from the surface of an object with a temperature T (temperature in Kelvin) and a total emissivity of $\epsilon$ is as follows:

$$P = \epsilon \sigma T^4 \qquad (1)$$

where $\sigma$ is the Stefan Boltzmann Constant. Thus, the wafer pattern effects due to the chip patterns on the wafer frontsides can cause serious localized temperature non-uniformity problems, resulting in process non-uniformities, degradation of process repeatability, and even formation of slip dislocation.

(2) Top wafer heating using a single array of linear tungsten halogen lamps. This type of RTP system design has been introduced (for instance by AG Associates of U.S.A.) for RTCVD applications. A common configuration for this type of RTP system employs a quartz showerhead between the optical quartz window and the wafer within a cold-wall RTP process chamber. These systems may use wafer rotation by inserting a ferrofluidic feedthrough from the chamber bottom or wafer backside. For this type of RTP system design, wafer rotation may somewhat alleviate the temperature and process non-uniformity problems associated with the use of non-axisymmetrical illuminator designs; it does not, however, solve the problem completely. Lack of illuminator design axisymmetry and lack of appropriate emissivity-compensated multi-point pyrometry result in fundamental limitations and problems. These systems also suffer from the frontside pattern-induced temperature and process non-uniformities described earlier. Another significant problem with this type of RTP design is equipment state draft and process non-uniformity problems due to depositions on the quartz showerhead in RTCVD applications. Since the quartz showerhead is placed between the semiconductor wafer inside the process chamber and the external non-axisymmetrical illuminator used for frontside/top side wafer heating, any unwanted depositions on the quartz showerhead will affect the amount of optical power absorption by the semiconductor wafer.

(3) Two-sided tungsten-halogen lamp heating combined with a heated wafer susceptor. Some commercial RTP systems, (Applied Material of U.S.A. and ASM of the Netherlands have introduced RTP systems based on this type of design for silicon epitaxy and polysilicon deposition (RTCVD) applications) employ a holding wafer susceptor made of a light-absorbing material such as graphite, silicon-carbide-coated graphite, or silicon carbide. These systems rely on the use of a relatively high-thermal mass heated susceptor in order to partially overcome the temperature non-uniformity and process repeatability problems. Although the use of a heated susceptor may reduce these problems, it does not completely eliminate them. Moreover, the use of a heated susceptor may introduce some new problems. For instance, in RTCVD applications, the heated susceptor can be coated by the material being deposited on the wafer (e.g., doped or undoped polysilicon; silicon dioxide; silicon nitrate; etc.). The unwanted depositions on the susceptor can result in particulate generation, cross contamination process uniformity drifts, as well as temperature measurement and process control problems. Temperature movement and control in these RTP systems is usually based on the use of pyrometry for measuring the susceptor temperature (or embedded thermocouple in the susceptor). The pyrometry measurements may experience significant errors due to the emissivity validations caused by the unwanted depositions on the susceptor. The RTP systems with this type of design may also employ wafer rotation to improve process uniformity. Again, however as outlined in the previous RTP systems, while wafer rotation may somewhat alleviate the temperature and process non-uniformity problems associated with the use of non-axisymmetrical illuminator designs, it does not solve the problem completely. The use of a heated susceptor has another major disadvantage since it slows down the temperature control dynamics by reducing the maximum achievable heat-up and cool-down rates by a significant margin. This results in the degradation of the process throughput and an increase in cost-of ownership (COO).

(4) Hot wall RTP with a graded-zone single-wafer furnace. High-Temperature Engineering (THE) of U.S.A. has introduced an RTP system based on the use of a graded-temperature resistivity-temperature hot-wall furnace. Wafer heating and cooling cycles are performed by rapidly moving a wafer between the furnace cold and hot zones. Although this type of system can provide good steady-state temperature uniformity, it lacks the means for transient dynamic uniformity control. Another disadvantage of this type of RTP system design in the need for rapid large-scale mechanical movement of the wafer in order to ramp-up or ramp-down the wafer temperatures. Moreover, this type of RTP system design can still experience a localized temperature and process uniformity problems due to the device patterns effects.

In addition to the uniformity problems, conventional RTP systems also experience problems making accurate temperature measurements. Currently, the majority of RTP systems rely on pyrometric temperature measurements. Pyrometric measurements, however, have several limitations. One of the most important limitations is that the temperature measurements are dependent on the emissivity of the wafer. The emissivity is a function of various wafer states including thin films, substrate doping, and backside roughness. Emissivity is also dependent on temperature. Another important limitation of pyrometric temperature measurement in lamp heated semiconductor processing is that there is a spectral overlap between radiation from the lamps used to heat the wafer and the radiation from the wafer used to measure temperature. The pyrometer cannot distinguish between the radiation from these two sources, and thus error is introduced into temperature measurement. The error is particularly significant at low wafer temperatures during temperature ramp-up where thermal radiation from the wafer is limited but lamp radiation is significant. Lamp radiation often provides a major obstacle in making accurate measurements of temperatures below 500° C. using pyrometric techniques.

SUMMARY OF THE INVENTION

Therefore a need has arisen for an improved Rapid Thermal Processing (RTP) axisymmetric multizone illumination system and method for microelectronics manufacturing equipment that incorporates embedded multiprobe sensors, including pyrometric sensor.

A need exists for an improved RTP illuminator system and method and an improved RTP equipment configuration that provides precision control of the RTP process uniformity, effective wafer temperature uniformity and process repeatability.

A further need exists for an improved RTP illuminator system and method and an improved RTP equipment configuration that eliminates the frontside pattern effects on temperature and process uniformity.

A further need exists for an improved RTP illuminator system and method and an improved RTP equipment configuration that can meet process performance and process control requirements for RTA, RTO, as well as RTCVD applications.

A further need exists for an improved RTP illuminator system and method and an improved RTP equipment configuration that eliminates or greatly reduces the temperature and process control problems created by unwanted particulate deposition on RTP system components.

A further need exists for an improved RTP illuminator system and method and an improved RTP equipment configuration that does not significantly reduce the maximum achievable heat-up and cool-down rates.

A further need exists for an improved RTP illuminator system and method and an improved RTP equipment configuration that facilitates integration of a multipoint emissivity-compensated and lamplight compensated pyrometry sensor system to enable dynamic real-time multi-zone control of water temperature.

Moreover, a need exists for an improved RTP illuminator system and method and an improved RTP equipment configuration that provides equipment extendibility to larger-wafer (300 mm and beyond) processing applications via simple scaling design rules.

Additionally, a need exists for an improved RTP illuminator system and method and an improved RTP equipment configuration that can establish improved built-in equipment reliability and uptime.

A further need exists for an improved RTP illuminator system and method and an improved RTP equipment configuration that can measure wafer temperature while accurately adjusting for the emissivity and lamp radiation effects.

A further need exists for an improved RTP illuminator system and method and an improved RTP equipment configuration that incorporates pyrometric temperature sensors for measuring temperature of a substrate.

In accordance with the present invention, an axisymmetric RTP illuminator system and method and an RTP equipment configuration are provided that substantially eliminate or reduce disadvantages and problems associated with previously developed RTP systems.

More specifically, a system is provided for rapid thermal processing of a substrate in a process chamber while measuring and controlling the temperature at the substrate to establish substantially uniform substrate temperature in real time. The system includes an axisymmetrical multi-zone illuminator having a plurality of substantially concentric rings of heating lamps to direct optical power toward said substrate, a fluid cooled optical reflector facing the substrate frontside and having a relatively high optical reflectivity. The system also includes a multizone temperature measurement system having a plurality of pyrometry sensors coupled to said multi-zone illuminator, a system for real-time measurement and compensation of substrate emissivity and illuminator lamp light interference effects, and a multi-variable temperature controller for providing multi-zone real-time temperature control. The system also incorporates a plurality of illuminator lamp power supplies.

An important technical advantage of the present invention is that it provides dynamic multi-zone temperature and heating process uniformity across a semiconductor wafer during manufacture of the wafer.

Another technical advantage of the present invention is that it provides axisymmetric heating to provide temperature and heating process uniformity across a semiconductor wafer.

The present invention provides another technical advantage by providing precise control of the RTP process uniformity and process repeatability.

The present invention provides another technical advantage by eliminating the frontside pattern effects on temperature and process uniformity.

Another technical advantage of the present invention is the ability to meet process performance and process control requirements for RTA, RTO, as well as RTCVD applications.

Yet another technical advantage of the present invention is that it eliminates or greatly reduces the temperature and process control problems created by unwanted particulate deposition on RTP system components.

Still another technical advantage of the present invention is that it does not significantly reduce the maximum achievable heat-up and cool-down rates.

The present invention provides another technical advantage by facilitating integration of a multipoint emissivity-compensated and lamplight compensated pyrometry sensor system to enable dynamic real-time multi-zone control of water temperature.

The present invention provides yet another technical advantage by providing equipment extendibility to larger-wafer (300 mm and beyond) processing applications via simple scaling design rules.

The present invention provides yet another technical advantage by measuring wafer temperature while accurately adjusting for the emissivity and lamp radiation effects.

The present invention provides still another technical advantage by incorporating pyrometric temperature sensors for measuring temperature of a substrate into the multizone illuminator.

BRIEF DESCRIPTION OF THE DRAWINGS

For a more complete understanding of the present invention and the advantages thereof, reference is now made to the following description which is to be taken in conjunction with the accompanying drawings.

FIG. 5A shows a schematic diagram of a reference or dummy lamp cavity with a reference bulb and a lightpipe;

FIG. 5B shows another embodiment of a reference or dummy lamp cavity that can be used in conjunction with the present invention;

FIG. 5C shows an embodiment of a multiprobe having a lightpipe and an electronic assembly for use as a probe in the present invention;

FIG. 8 is a schematic diagram of a lamp illustrating the lamp removal capability of the present invention;

FIG. 9 is a schematic diagram of another embodiment of the present invention illustrating the offset heating feature of the alternative embodiment;

FIG. 10 is a schematic diagram of a bus ring clamp that can be used in conjunction with the present invention;

FIG. 11 is a schematic diagram illustrating one method of forming the reflective plate of the present invention;

FIG. 12 is a schematic diagram illustrating another method of forming the reflective plate of the present invention;

FIG. 21B shows another embodiment of a modulation circuit of the multicomp system electronics;

FIG. 21C shows another embodiment of a modulation circuit of the multicomp system electronics;

DETAILED DESCRIPTION OF THE INVENTION

Preferred embodiments of the present invention are illustrated in the FIGUREs like numerals being used to refer to like and corresponding parts of the various drawings.

The present invention relates to an axisymmetrical multizone illuminator having embedded sensors for advance RTP applications that provides uniform thermal processing and accurate temperature measurement over a semiconductor wafer during manufacture. The present invention can perform multi-zone heating of the backside of a wafer in conjunction with an optically reflecting object facing the wafer frontside in order to eliminate the device patterns effects on wafer temperature and process uniformity. The present invention also includes multiple sensors, including pyrometric temperature sensors, embedded within the multizone illuminator housing of the present invention for taking wafer and state measurements in an RTP process chamber.

The multizone illuminator is used to control the temperature and the temperature uniformity of the heated substrate in an RTP process. The illuminator showerhead (the actuator) can work in conjunction with temperature sensors and a controller to provide optimal closed-loop control of the substrate temperature. The key criteria for an ideal illuminator showerhead design include:

Providing adequate separation between the multiple zones of heating to allow independent control of the temperature as function of radial position.

Providing adequate overlap of radiation pattern between the multiple zones to provide smooth temperature transition between radial zones on the wafer.

Providing adequate azimuthal uniformity to allow uniform azimuthal heating of the substrate without substrate rotation.

Providing adequate optical power, as well as adequate optical power density to achieve the required substrate temperatures.

Incorporate reference bulbs for enhanced pyrometric temperature measurement of the substrate.

Accommodating lightpipes used for temperature measurements.

Providing easy identification and replacement of defective bulbs.

Allowing adjustment in lateral and horizontal position from the substrate.

Figure 1:
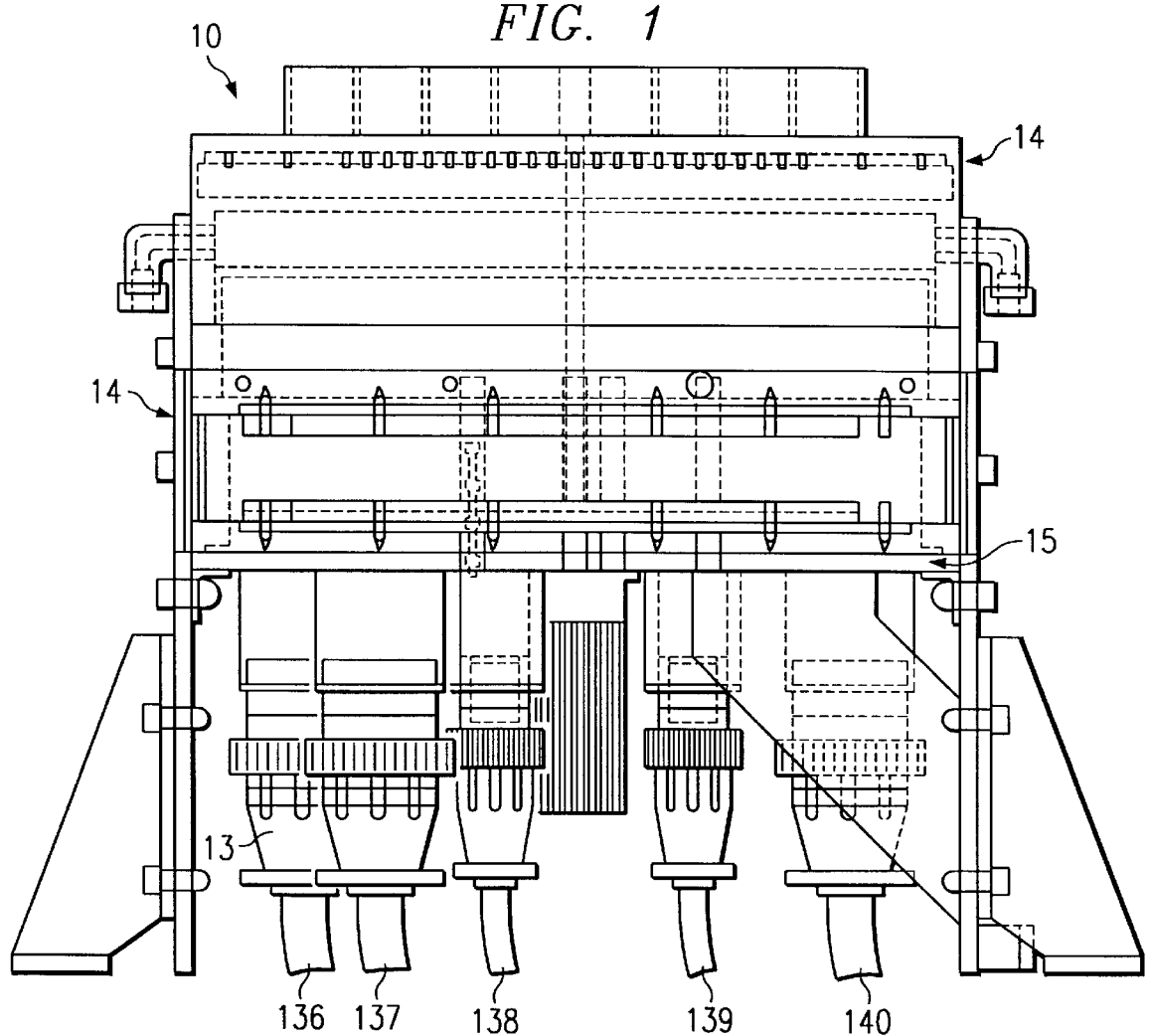
FIG. 1 shows one embodiment of the multizone illuminator of the present invention.
Figure 2:
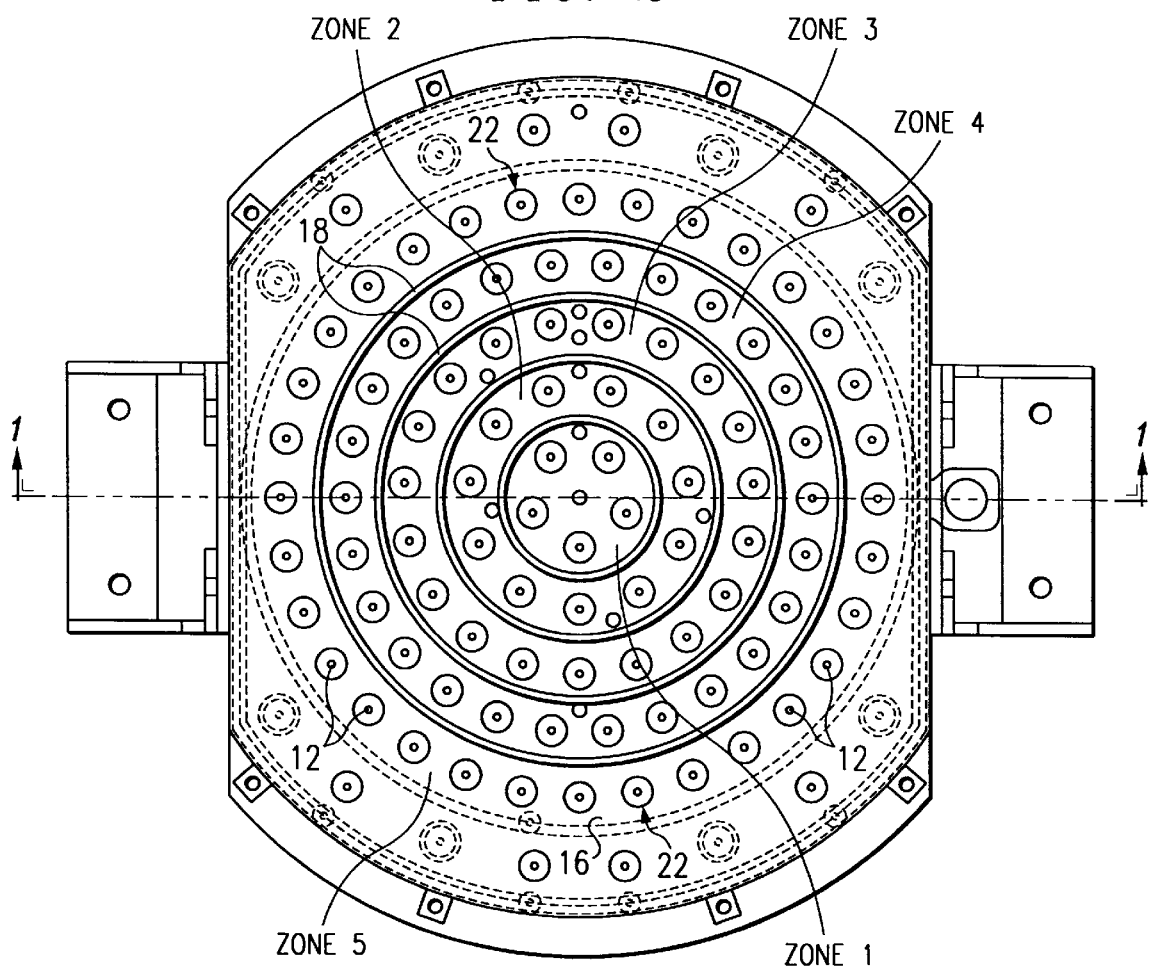
FIG. 2 shows a top view of the embodiment of the multizone illuminator of FIG. 1.

FIG. 1 shows one embodiment of the multizone illuminator 10 of the present invention that includes an illuminator housing 14, base plate 15, and power connections 136, 137, 138, 139, and 140. FIG. 2 show a top view of the FIG. 1 embodiment that includes multiple concentric rings of heating lamps 12, a fluid cooled reflector 16, and a plurality of spacer rings 18 to optimize the inter-zone optical flux interaction. Each concentric ring of heating lamps 12 represents a "zone" of heating. FIG. 2 shows a five zone illuminator (zones labeled zone 1–5). Connection 136 provides power to lamps 12 in zone 1, connection 137 provides power to lamps 12 in zone 2, connection 138 provides power to lamps 12 in zone 3, connection 139 provides power to lamps 12 in zone 4, and connection 140 provides power to lamps 12 in zone 5. Preferably, five concentric axisymmetric zones of tungsten-halogen lamps are used for establishing dynamic multi-zone temperature uniformity control on 200-mm semiconductor wafers. The axisymmetrical multi-zone illuminator (with five circular zones of tungsten-halogen lamps for 200 mm wafer heating) can be used to heat the wafer from the backside through a quartz window. In a particular embodiment, the five-zone illuminator employs a total of 93 tungsten-halogen bulbs in five circular zones for uniform heating of wafers up to 200 mm in diameter. It is expected that for future 300 mm diameter wafers, scaled-up embodiments of the present invention will employ seven illuminator zones and seven emissivity compensated pyrometry probes for complete temperature uniformity and repeatability control.

Figure 3:
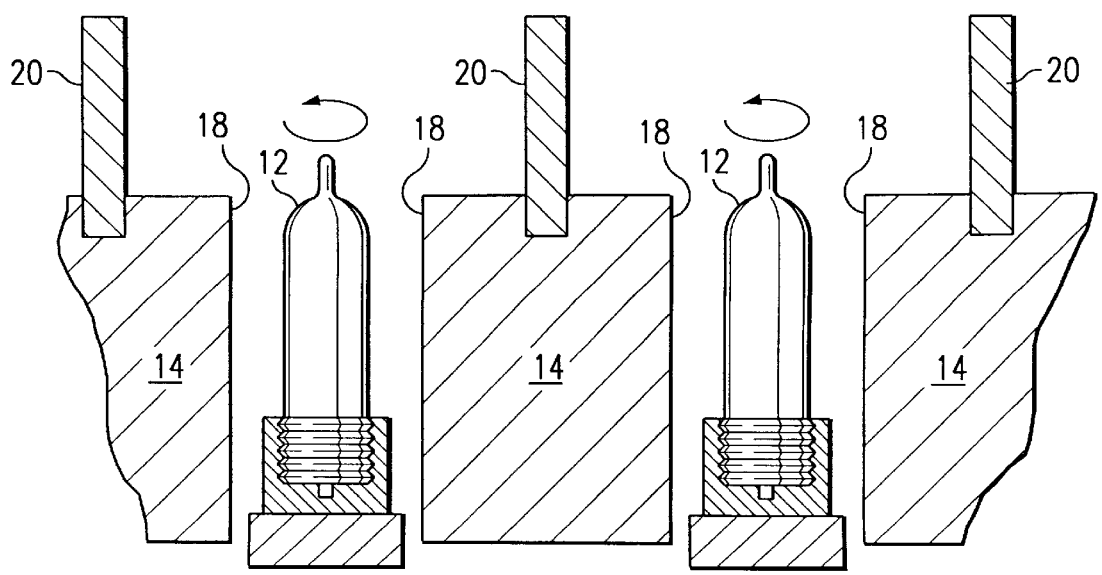
FIG. 3 shows a schematic diagram of one heat lamp configuration within the reflective cylinder housing of the present invention.

Adequate separation between the multiple zones of heating is achieved by the design of the reflective housing 14 around the lamps 12 and the design of the optical spacer rings 20 between adjacent zones. As shown in FIG. 3, the lamps (or bulbs) 12 are recessed into highly reflective housing cylinders 18 to collimate the radiation emanating from the individual bulbs 12. The degree of collimation is a function of how deeply the bulbs are recessed within the housing cylinders. The deeper a lamp 12 is recessed, the more collimated the light beam radiated to the substrate. Determining the optimal position of the lamps 12 withing the reflective housing cylinder 18 requires balancing the detrimental effect of having too much collimation (and the reduction in the optical power) with the desirable effect of separating the radiation between illuminator zones.

As shown in FIG. 3, spacer rings 20 are placed on the illuminator housing 12 between adjacent rings of lamps 12 (i.e., separating adjacent zones). Spacer rings 20 can also tailor the characteristics of lamp radiation. As the height of the spacer radiation rings 20 increases, the separation between the radial zones increases to provide improved independent control of the temperature as function of radial position. However, the spacer rings 20 can have an excessive height that will lead to the detrimental effects of having too much separation and the loss in reliability/life of the rings. As the spacer rings become too tall, the aspect ratio increases and the ability to cool the spacers using conductive and convective methods diminishes. At the same time, as the surface area of the rings increase, the radiation absorption from the lamps increases, raising the temperature of the rings to unacceptably high levels. The height of the reflective separation rings must balance the height and surface area considerations against the value of having increased separation. The spacer rings 20 are preferably optically reflective (e.g., via gold plating or evaporation or sputtering). The spacer rings 20 are cooled from the coolant flowing in the base reflector and the forced air cooling provided as air travels through the bulb sockets.

First order azimuthal uniformity in heating the substrate with the multizone illuminator 10 of the present invention is provided by the axisymmetric nature of the lamp arrangement as shown in FIG. 2. The lamps 12 are shown arranged in concentric rings, with larger radius rings having a greater number of lamps 12. For the five zone embodiment of FIG. 2, zone 1 (the inner most zone) has five lamp cavities 22, while zone 5 (the outer most zone) has thirty-two lamp cavities 22. To the first order, the real density illumination provided by the bulbs 12 is constant over the substrate in each zone. Thus, uniform application of electrical power to each zone of bulbs 12 will result in uniform illumination of the substrate. While real time actuation of the variable powers is performed between the rings (i.e., between zones), the bulbs 12 within a single zone are typically connected to a single power source and are generally controlled as a group. In an alternative embodiment, the bulbs 12 within a single zone could couple to more than one power source.

In order to provide adequate heating power to the substrate, the lamps 12 must be closely grouped on the multizone illuminator 10. The dense packing of the bulbs 12 requires designing a system for cooling the lamps 12. The present invention incorporates both water and air cooling to use thermal conduction, convection, and radiation to provide proper thermal management of the lamps 12.

Figure 4:
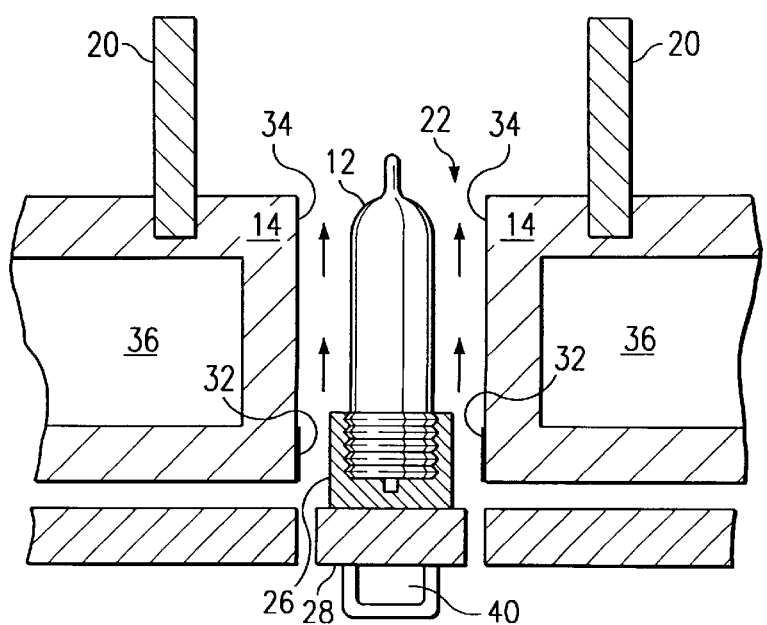
FIG. 4 shows a schematic diagram illustrating the lamp cooling provided by an embodiment of the present invention.

As shown in FIG. 4, the lamp base 24 of lamp 12 is cooled through control of the conduction, convection and radiation. Lamp base 24 can be screwed into socket 26. Socket 26 is rigidly clamped to a metallic socket plate 28 to aid in the transfer of heat from lamp base 24 through socket 26 to metallic socket plate 28. The socket plate 28 can include vent holes (not shown) around the socket 26 to cool the sockets by forced air convection. As shown in FIG. 4, the present invention can flow cool air flows across the sockets 26 prior to heat emitting from the lamp jacket 30 to provide cooling to the lamps 12. The air flows from the bottom of the bulb cavity 22 (from socket 26 end) to the top of bulb cavity 22 and out of bulb cavity 22 on the spacer ring side of illuminator housing 14. Additionally, the housing cylinder 18 includes a highly emissive area 34 that is coated with a highly emissive material to aid in the absorption of the radiation from the lamps 12. This highly emissive area 34 eliminates or greatly reduces the reflection of the filament energy from the lamp 12 into the socket 26 and lamp base 24.

Cylinder housing 18 that encloses the lamps 12 is also both water and air cooled. As shown in FIG. 4, the water channel 36 allows cooling water to contact the cylinder housing 18 on the side opposite the lamp 12. The cylinder housing 18 is further cooled by the air flowing through the lamp cavity 22. Bulb cooling channel 40 also provides a path for cooling water to flow near bulb 12. The flow of the cooling fluids (water and air) provide cooling of both the cylinder and the lamps. The spacing between the lamp 12 and the cylinder housing 18 is more constricted that the spacing between other parts (for example, the socket 26 or the socket base plate and the cylinder housing 18) to ensure that the air flow rate in the multizone illuminator controlled by the lamp-cylinder spacing. The constriction between the lamp 12 and the cylinder housing 18 forces the air flow velocity to increase to a maximum at that point to provide enhanced convective cooling. In addition, uniform flow rate is achieved in each bulb cavity 22, independent (to the first order) of the arrangement of air flow inside the multizone illuminator 10.

The present invention can force air flow in either direction within the bulb cavity 22. As opposed to the flow arrows shown in FIG. 4, in situations where the heated air needs to be ducked out of the manufacturing environment, the cooling air flow passes around the bulbs, through the socket plate then out of the multizone illuminator assembly 10.

Moreover, preferably the illuminator housing 14 has a number of hollow lightpipes 38 that provide through holes for insertion of multi-point optical pyrometry temperature probes (and other probes) for real-time measurements and control of wafer temperature. Lightpipes 38 can be positioned adjacent lamps 12 in bulb cavity 22. These lightpipes 38 preferably view the substrate/wafer surface through multiple holes (not shown) penetrated through the reflector surface of the illuminator housing 14 without interference from the optically reflective spacer rings 20. Lightpipes 38 are designed to collect thermal radiation from a particular point on the heated substrate. Lightpipes 38 can also be used to measure the reflectivity of the substrate at the particular point. Because some elements in the lightpipe 38 may fail if subjected to extreme heats, and more importantly, because the heating of some of the optical elements in the lightpipe 38 will result in errors in the temperature measurement, the lightpipes 38 needs to be effectively cooled.

Lightpipe 38 cooling is performed primarily via conduction to the water-cooled illuminator assembly 10. Positioning the lightpipe 38 close to the illuminator assembly within the lightpipe channel (not shown) ensures good thermal contact. In addition to the conductive thermal contact, cooling can be established by channeling cooling air around the lightpipes 38. The lightpipe front end 42 can be positioned either flush with the lamp assembly or slightly recessed to ensure that the tip of the lightpipe is not heated via direct radiation from the lamps.

The illuminator housing 14, in its preferred embodiment, has a number of dummy (or reference) lamp cavities which are fully isolated from the actual heating lamps and from the radiative wafer in the process chamber. As shown in FIG. 5, the present invention also includes dedicated reference bulb cavities 52 within the housing assembly to accommodate reference or dummy bulbs 42. Reference bulbs 42 are used, in conjunction with lightpipes 38 and pyrometric sensors (not shown) to measure and compensate for changes in substrate emissivity and lamp interference. Lightpipes 38 and pyrometric sensors can measure the optical radiation from the reference lamps 42 at a particular wavelength to measure the temperature of the substrate. The reference bulb sensors (lightpipes and pyrometric sensors) measure the both the DC and AC optical radiation from the reference lamps 42 to measure and compensate for emissivity and lamp interference effects. The maximum number of reference (or dummy) lamp cavities 52 is typically equal to the number of illuminator zones which are independently controlled by a dynamic multi-zone controller. The reference lamp cavities 52 are preferably placed around the peripheral region of the illuminator housing 14 so that they do not interfere with the heating zones.

The dedicated reference lamp cavities 52 within the illuminator housing 14 can also be used to house an extra bulb 12 when necessary. For example, if the number of bulbs 12 in a particular zone is even, to supply a reference bulb 42, an extra bulb must be supplied to allow two bulbs 12 to connect in series electrically. To accommodate this, an extra bulb 12 can be placed in a reference bulb cavity 52 and electrically connected to one of the bulbs 12 within the zone.

Furthermore, connecting a reference bulb 42 (or an extra bulb) in the reference cavity with a bulb 12 within the zone allows easier identification of defective (i.e. open-circuited) reference bulbs 42. The radiation of the reference bulb 42 in the reference cavity 52 is not readily visible because the reference bulb 42 is almost completely enclosed within the reference bulb cavity 52. However, by connecting a reference bulb 42 (or extra bulb) to a bulb 12 in the zone, if a reference bulb 42 (or extra bulb) fails, the bulb 12 connected in series within the zone will also fail to radiate, thus facilitating ready identification of defective bulbs.

The reference bulb cavity 52 is designed as illustrated in FIGS. 5A and 5B. The reference bulb 42 is enclosed within the reference bulb cavity 52 to minimize the optical radiation entering the cavity 52 that can interfere with the optical measurement made by the lightpipe 38. The optical radiation from the reference bulb 42, consisting of both slowly time varying (dc) and rapidly time varying (ac) signals, can be channeled by the lightpipe 38 into the optical detector (not shown) mounted on the bottom of the illuminator 10. FIG. 5C shows one embodiment of a multiprobe 37 that can include lightpipe 38 and electronic assembly 39 for performing measurements such as temperature measurements. The multiprobe 37 can connect to the multizone illuminator within dummy bulb cavity 52. The inner surface of the reference bulb cavity 52, in contrast to the bulb cavities 22, is not polished or coated with an optically reflective material to enhance the absorption of the radiation of the bulbs. In addition to cooling by absorption of radiation by the water cooled cavity walls of the illuminator housing 14, an air channel 44 formed in the reference bulb cavity 52 allows air to flow over the reference bulb 42 to convectively cool the bulb. Cooling air enters the reference cavity 52 at the cooling air vents 46 located at the base 28 of the bulb sockets 26. The cooling air passes around the socket 26, the bulb base 28, the bulb 42, and is finally channeled out of the reference bulb cavity 52 via the upper cooling air vent 48. As with the lightpipes 38 used for the measurement of substrate temperature, the lightpipes 38 located in the reference bulb cavity are also actively cooled. The reflective area 41 of the region directly above the lightpipe 38 is made more reflective than the remainder of the reference bulb cavity 52 to enhance the reflectivity of the lamp radiation, thus allowing a greater signal to be received by the detector.

Figure 6:
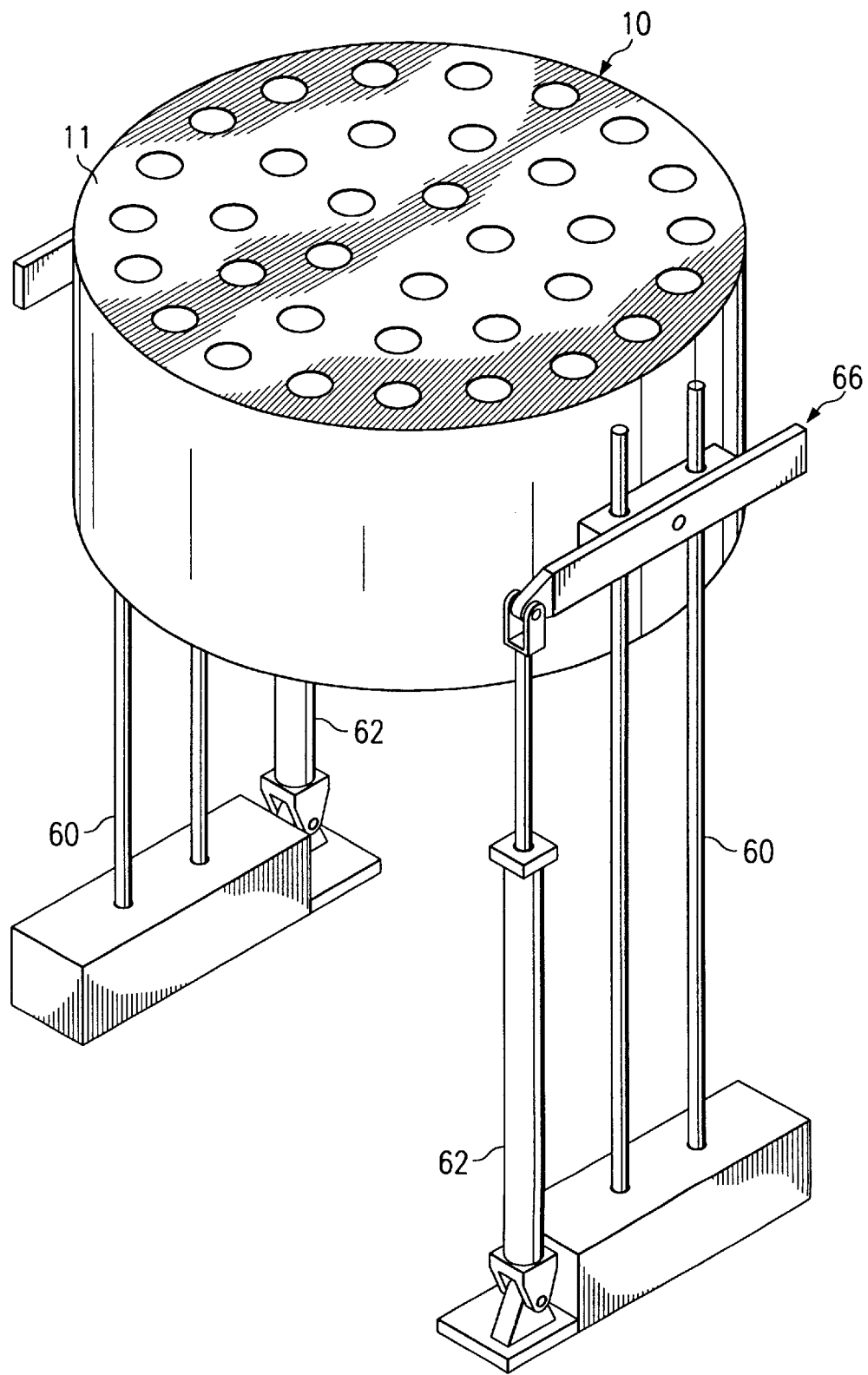
FIG. 6 shows one embodiment of the present invention in an up/non-pivoted position.
Figure 7:
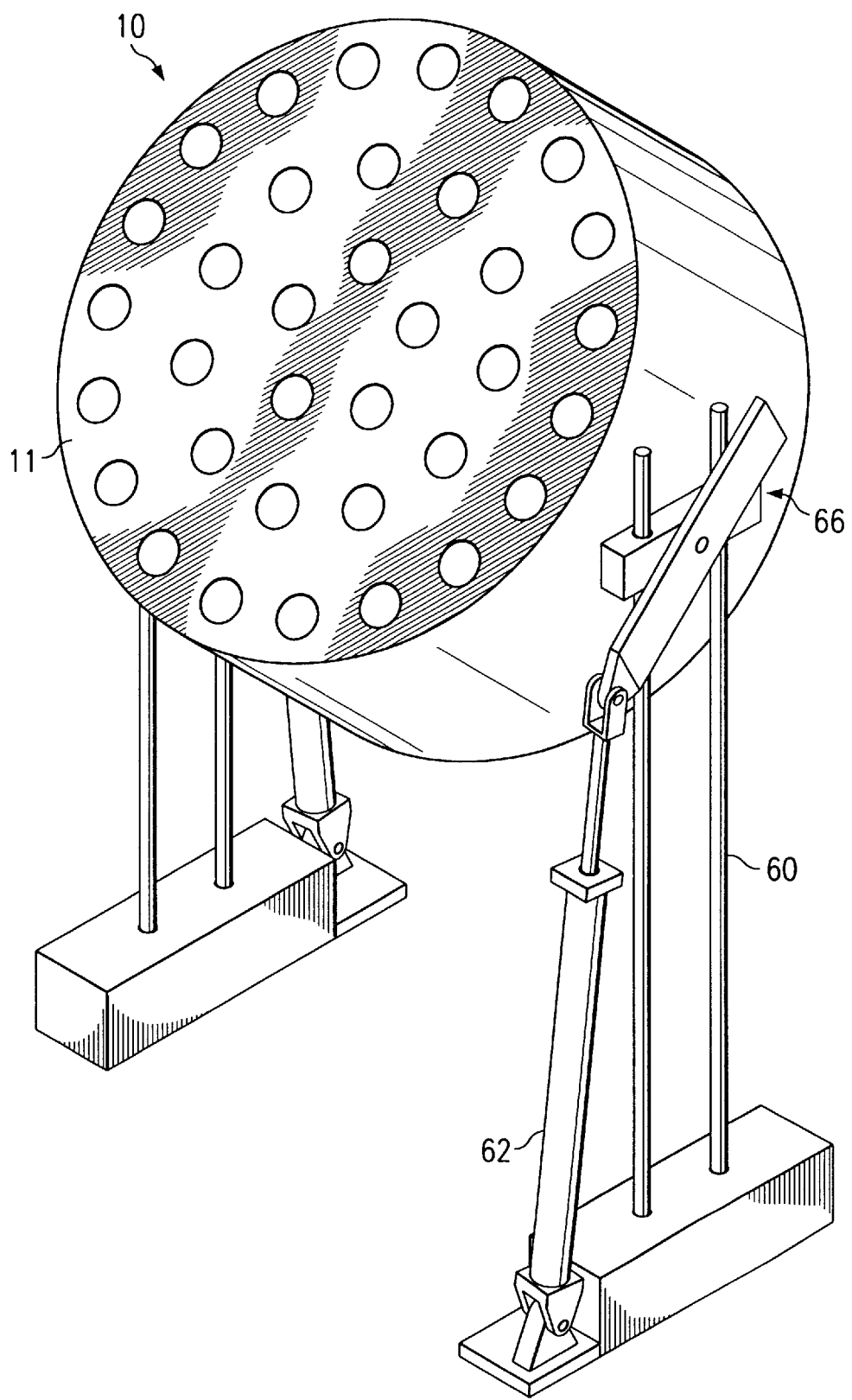
FIG. 7 shows the embodiment of the present invention of FIG. 6 in a lowered/pivoted position.

The illuminator assembly 10 of the present invention is designed to provide enhanced serviceability, as shown in FIGS. 6–8. FIG. 6 illustrates mounting the illuminator assembly 10 on a pair of linear slides 60 with the illuminator 10 counter balanced by pneumatic actuators 62. FIG. 7 illustrates the position of the illuminator 10 in the lowered position. The lowering and lifting of the illuminator assembly 10 is aided by the pneumatic actuators 62. FIG. 7 also illustrates the lamp assembly 11 in a pivoted position around pivot assembly 66. The pivoting of the illuminator assembly 10 facilitates access to the bulbs 12. All bulbs 12 in the illuminator 10 can be turned on at low power to visually check for open-circuited, or low-power bulbs. As shown in FIG. 8, bulbs may be directly removed and replaced by unscrewing the bulbs 12 from the threaded base and socket and removed from the top of the illuminator 10.

The illuminator assembly 10 can be adjusted in both the horizontal and vertical position for optimum temperature controllability. The vertical distance of the illuminator (z-direction) from the substrate has an effect on opposing forces of the overlap (cross-talk) between the zones and the separability of the radiation between the zones. All other effects kept constant, the further the distance between the illuminator and the substrate, the greater the degree of overlap between the zones. This overlap in zones, in turn, results in a lower separation of the radiation from the zones.

Movement of the illuminator in the horizontal direction (x-y direction) has an effect on the amount of wash-out in the thermal pattern during substrate rotation. With the illuminator placed exactly concentric with the substrate, the wash-out effect is negligible because the axisymmetric pattern of the bulbs will be maintained with substrate rotation. In contrast, if the center of the lamp assembly_is displaced from the center of rotation of the substrate, individual bulbs 12 in the illuminator 10 will illuminate varying radii on the substrate. During substrate rotation, the effect will be to wash-out (or broaden) the radiation profile of the illuminator 10. This effect is important in obtaining a good balance between the separation between the zones needed for real-time temperature uniformity control, and the smooth transition between the zones needed for intra-zone temperature uniformity.

The variation in the vertical distance from the substrate is achieved by positioning the illuminator along the linear slides 60. Upon determining the optimal vertical position, the illuminator can be rigidly locked in place. The balancing effect of the pneumatic actuators 62 also aid in preventing creeps in the vertical position. The horizontal position of the lamp can be adjusted by adjusting the base 68 of the two linear slides 62 which hold the illuminator assembly.

The use of the lateral offset as shown in FIG. 9 is a critical element to the illuminator design. The present invention utilizes this technique to deliver distinct optical separation of the zones in terms of optical radiation, while achieving thermal smoothness across the substrate by rotating the substrate. As shown in FIG. 9, an offset lamp assembly 90 places each bulb 12 in a particular zone (ring) at a different radial position on the substrate. Rotating the offset lamp assembly 90 at a high enough rate can smooth out the effect of the varying bulb radius within a zone to provide a smooth thermal profile that, when combined with adjacent zones, provides uniform temperature distribution over the wafer. The duration of rotation required for an offset lamp system 90 to produce the desired effect should be shorter than the effective thermal time constant needed for the diffusion of heat between bulbs 12. In other words, the rotation, and therefore optical radiation averaging, can occur fast enough that the system provides a smooth thermal profile.

The base 15 of illuminator 10 has electrical power connections (136, 137, 138, 139, and 140) for the bulbs 12, cooling water connections, cooling air connections, and connections for the temperature sensors. The temperature sensors have connections for power and pyrometer signals. All connections to the base of the lamps can be easily removed to facilitate disassembly and assembly of the module.

The electrical connections to the lamps 12 are made on two electrical bus rings 92 for a single phase electrical power, and on three electrical bus rings 92 for three-phase electrical power. The electrical bus rings 92 are made of copper or other highly conductive material. The cross section of the bus rings 92 are large enough to provide adequate electrical conductance for given current requirements. The bus rings 92 have terminal points with tapped holes to secure the electrical leads from the bulbs 12. The bus ring 92 also has a larger capacity terminal point designed to secure the main electrical input.

Each ring of lamps (i.e., each zone) has a pair of electrical bus rings 92 for single phase operation or three electrical bus rings 92 for three-phase operation. For a five zone embodiment of the multi-zone illuminator of the present invention, the illuminator assembly 10 will have ten bus rings 92 for single phase operation and fifteen bus rings 92 for three phase operation. The bus rings 92 are arranged in concentric patterns corresponding to the geometry of the illuminator zones. As shown in FIG. 10, the bus rings 92 are held rigidly in place by an insulator structure 94 that acts to clamp the bus rings 92. The insulating structure 94 can be rigidly fixed to the illuminator assembly housing 14.

The reflective plate 16 of the illuminator can be manufactured by welding tubes to top and bottom plates as shown in FIG. 11. The plates should have appropriate welding grooves and stress relief grooves built in. Alternatively, the reflective plate can be fabricated by welding or brazing a plate to a machined out assembly as shown in FIG. 12.

Figure 13A:
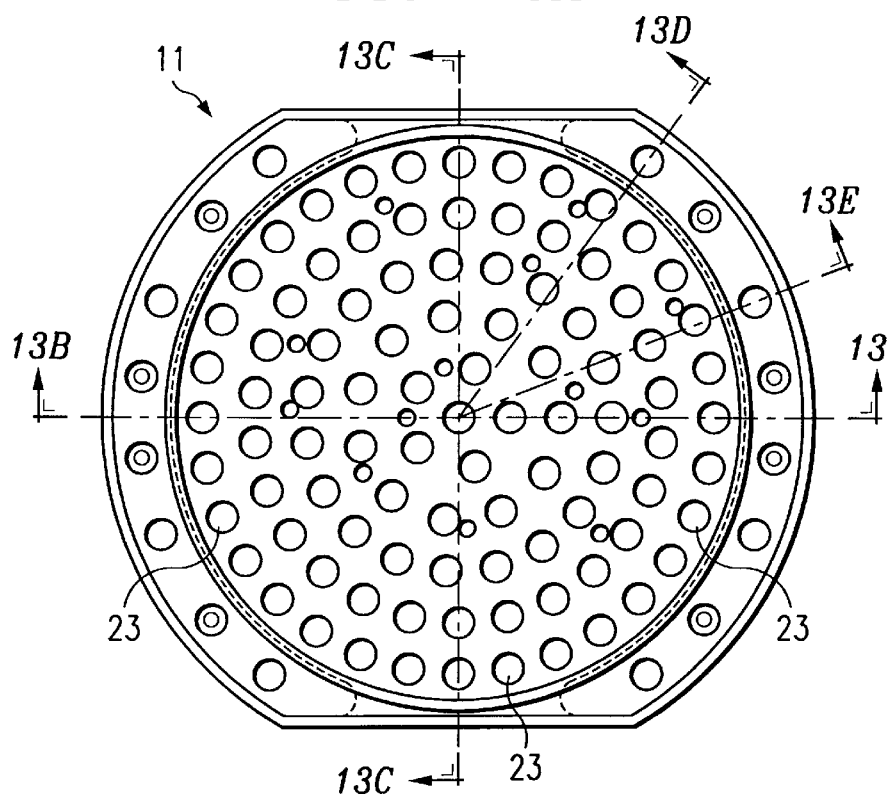
FIG. 13A shows a top view of one embodiment of a lamp assembly that can be used with the present invention.
Figure 13C:
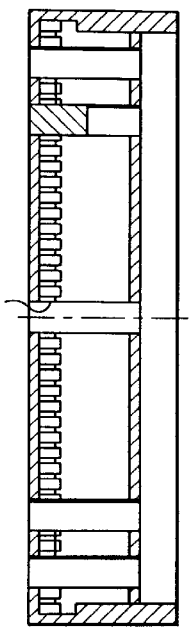
FIG. 13C shows a side view of the embodiment of FIG. 13A along section line B-B that shows a tube lamp feedthrough.
Figure 13B:
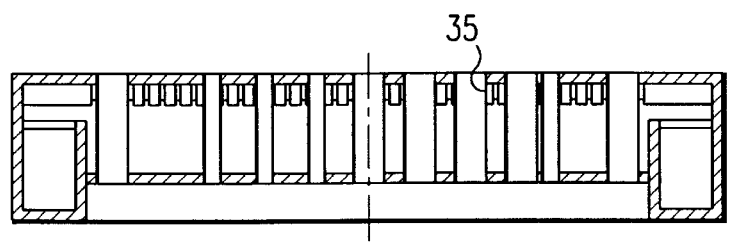
FIG. 13B shows a side view of the embodiment of FIG. 13A along section line A-A showing a pyrometry sensor feedthrough.
Figure 13D:
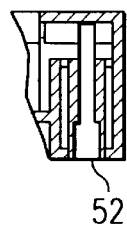
FIG. 13D shows a partial side view of the embodiment of FIG. 13A along section line C—C that shows a dummy bulb cavity.
Figure 13E:
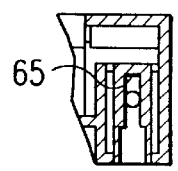
FIG. 13E shows a partial side view of the embodiment of FIG. 13A along section line D—D that shows a water tube.

FIGS. 13A–13F show an embodiment of the lamp assembly 11 that illustrates many of the features described. FIG. 13A shows a top view of lamp assembly 11 that shows five concentric rings of lamp feedthroughs 23. FIG. 13B shows a side view of the embodiment of FIG. 13A along section line A—A that shows a pyrometry sensor feedthrough 35 for receiving a pyrometry sensor. FIG. 13C shows a side view of the embodiment of FIG. 13A along section line B—B that shows tube lamp feedthrough 45 for receiving a lamp 12. FIG. 13D shows a partial side view of the embodiment of FIG. 13A along section line C—C that shows a dummy bulb cavity 52 for receiving a dummy or reference bulb 42 and a lightpipe 38. FIG. 13E shows a partial side view of the embodiment of FIG. 13A along section line D—D that shows a water tube 65 for providing cooling water to cool dummy or reference bulb 42 and lightpipe 38.

Figure 14:
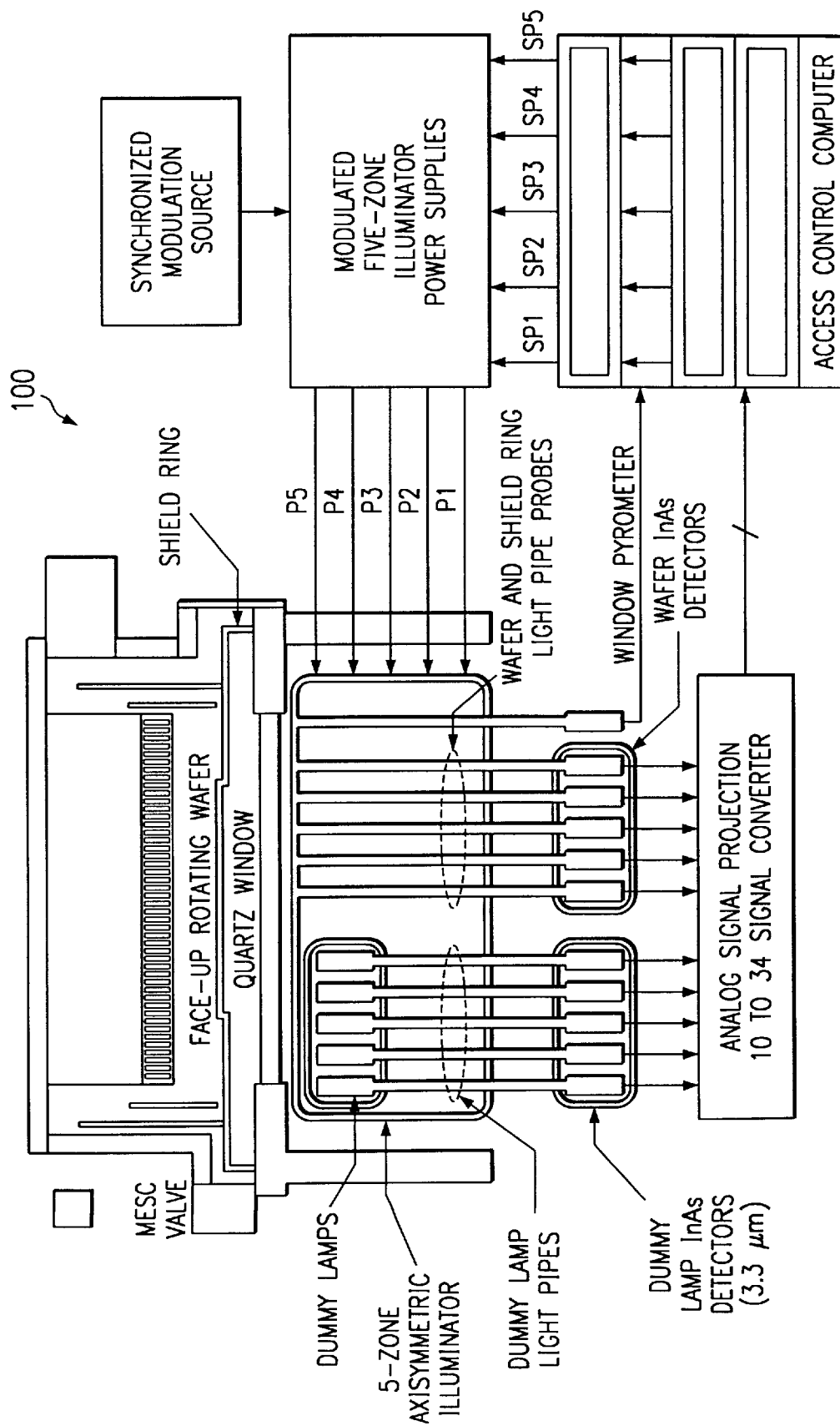
FIG. 14 shows a high level diagram of the present invention incorporating temperature sensors and other temperature control and measurement devices into a multizone illuminator.

The present invention also comprises a temperature measure and control system that incorporates into the multizone illuminator 10. The temperature measurement and control system 100 shown in FIG. 14 includes multi-zone pyrometers 102 (MultiProbe), a multizone emissivity and lamp interference correction system 104 (MultiComp), a dynamic model-based multizone temperature controller 106 (DynaZone), and multizone SCR's 108, as well as multizone lamps 12 and a multizone pyrometer calibration system 109 (MultiPAC). The multizone MultiComp™ system measures the real-time emissivity and lamp interference in each zone and provides wafer temperature adjusted for the emissivity and lamp radiation. The MultiComp™ system uses the radiation from the lamps as the reference source and the pyrometers as the detectors. Thus, the emissivity and lamp interference detector provides correction values corresponding to the exact spectral sensitivity of the detectors used to measure temperature. The detector also provides the emissivity and lamp interference value with identical spatial sensitivity and view factors as the pyrometers. The MultiProbe™, which consists of the lightpipe and front-end detection electronics are designed to provide maximum optical efficiency and stability at a range of 1 to 3.5 μm. In the particular system, wavelength of 2.5 μm was used. To compensate for the thermal effects of the quartz window between the heating lamp and the wafer, a pyrometer which operates at the absorptive band of quartz is used (8–14 μm). This is used to partially correct for the finite emissivity of quartz at 2.5 μm, as well as to provide a more efficient control algorithm. MultiPAC™ allows an automated calibration of the pyrometers with reference thermocouples. Instead of using TC instrumented wafers which are fairly expensive and require partial disassembly of the equipment, the MultiPAC™ system allows an automated sequence of pyrometer calibration without breaking vacuum. The temperature control system 100 of the present invention provides temperature control of ±2° C., 3 σ during steady state and ±5° C., 3 σ during ramps of 50° C./sec to 100° C./sec. Temperature control will be operational at temperatures above 400° C.

Temperature measurement system 100 of the multizone illuminator of the present invention can be controlled through a Pentium or 486-based computer through A/D, D/A and digital IO ports. There are interface electronics in between the computer and the various sensors and electronics. The control architecture 110 for temperature measurement and control is presented in FIG. 15. The remainder of the description of temperature control and measurement will describe a five zone illuminator. It should be understood that the present invention can operate over other multiple zone illumination arrangements.

The Process Module Controller 111 (PMC) initiates a thermal process cycle by providing the Multizone Temperature Controller 112 (MZC) a recipe for a desired temperature profile through a serial connection. The recipe will consist of a sequence of numerical values and control characters. Typical information provided by the PMC would consist of, for example, a command which states "ramp up at 50° C./sec to 500° C. and hold for 20 seconds, ramp up at 50° C./sec to 900° C. and hold for 180 seconds, ramp down at 30° C." The MZC 112 takes the recipe information from the PMC 111 and executes the recipe based on sensor and model data.

The interface from the MZC to the control and actuation electronics is established through circuit boards. The AT-MIO64F-5 board 113 is used primarily to obtain ten pyrometer readings (ten total readings from 5 multi-zone measurements and 5 lamp measurements in a five zone configuration), five MultiPAC thermocouple reference readings, and five RMS power readings from the SCR's. Actuation signals to control the position of the MultiPAC probes are also provided by the AT-MIO64F-5 board 113. The AT-AO-6 circuit board 114 is used primarily as a digital to analog convertor to provide the five control signals to the multizone SCR's.

In addition to the analog signal interface, the AT-MIO64F-5 board 113 handles low level interlocks that require fast reaction time. These interlocks are handled by the MZC 112 (as opposed to the PMC).

The MultiComp system solves a 15×10 system of equations for ten variables for a five zone RTP. For an n zone RTP, the MultiComp system solves a 3n×2n system of equations for 2n variables. In a five zone system five of the variables are the adjusted wafer radiance from the five zones of the wafer and a guard ring (e.g. SiC ring). The remaining five variables provide measurements of wafer reflectivity as seen by the five detectors. The reflectance measurement in conjunction with either a real-time or analytical transmittivity value can be used to obtain a real-time, in-situ measurement of wafer emissivity. The MultiComp™ provides an integrated solution to the two largest problems in pyrometric temperature measurements—lamp radiation interference and emissivity variations.

Figure 17:
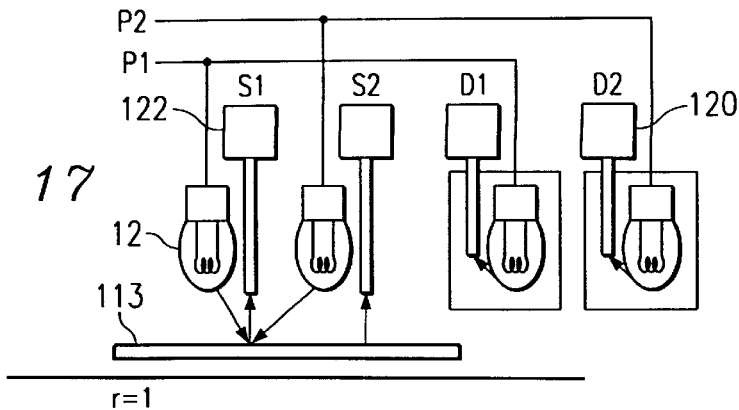
FIG. 17 shows a two zone multicomp system.
Figure 16:
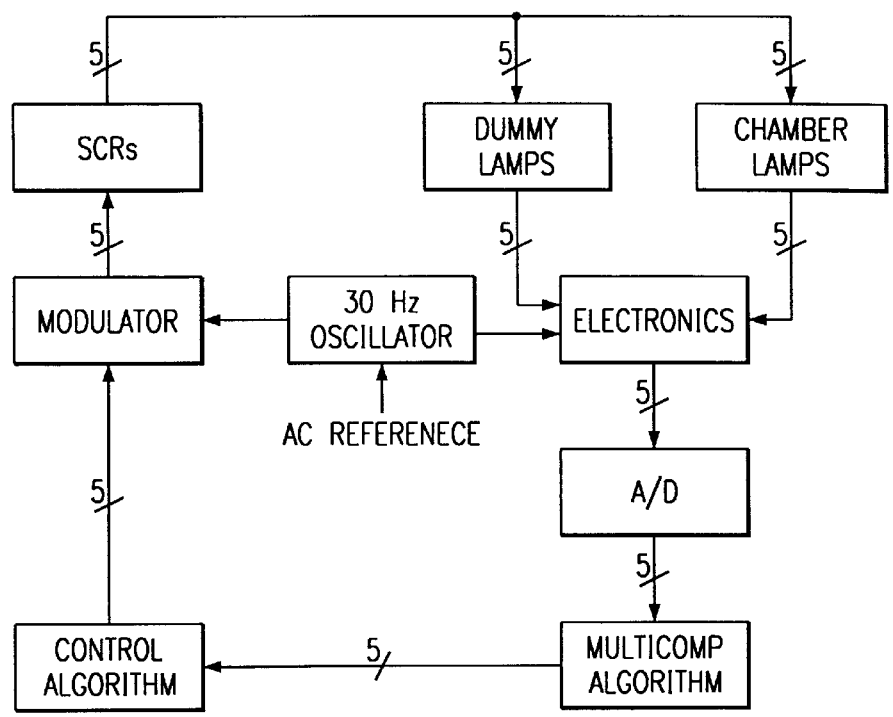
FIG. 16 is a block diagram illustrating the operation of an embodiment of the multicomp control system of the present invention.

FIG. 16 illustrates the principle of operation of the five zone MultiComp™ where the Rapid Thermal Processor (RTP) module has a lamp assembly with five independently controllable zones. Each of the five zones has a dummy lamp which is given the same electrical input as the lamps used for wafer heating. Single phase rectified power signals are used for all zones. The lamp control signal into the power supply of each lamp zone is modulated with an AC signal which is a multiple of 30 Hz synchronized to the AC line that drives the Silicon Controlled Rectifiers (SCR) that provide power to the lamps. Because the optical modulation depth is a non-linear function of the lamp power level, the modulation levels out of the lamps in each zone must be monitored continuously. This is accomplished with dummy detectors 120 (FIG. 17) which monitor the radiation from the five dummy lamps. The detectors 122 (FIG. 17) used to measure the wafer radiance image five points on the wafer using lenses. The lensed detectors 122 receive the combination of the radiation from the wafer 113 and the lamps 12 and the detected signal is processed by an electronic system. The processed signals are then digitized and sent to a computer. Because the radiation from the lamps are tagged with an AC, (e.g. 30 Hz) modulation, it can be separated from the wafer radiance using numerical techniques. The resulting wafer radiance values corrected for lamp interference are then used to measure wafer temperature. A simplified system for two lamp zones is illustrated in FIG. 17.

Figure 18:
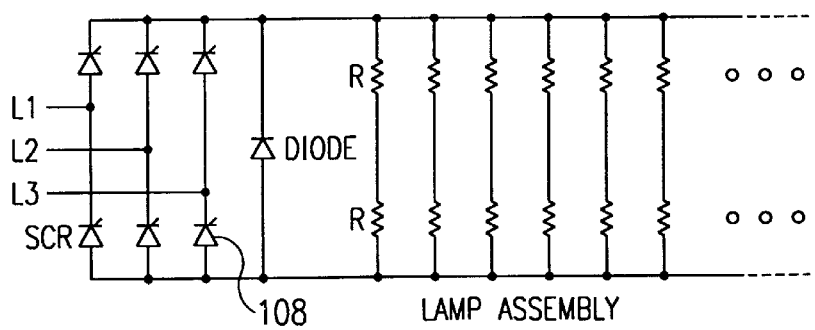
FIG. 18 is a schematic diagram illustrating the SCR configuration of the present invention.

FIG. 18 shows the SCR configuration for one embodiment of the temperature control and measurement system 100 of the present invention. The silicon controlled rectifiers (SCR) 108 are configured to provide phase angle controlled rectified outputs as shown in FIG. 18. Unlike the 3-phase configuration, the single phase configuration ensures that all lamps 12 within a zone receive equal modulation. Each of the five lamp zones have a dedicated SCR 108 that drives the lamps 12. The power (current) outputs of the five SCRs 108 are chosen to accommodate the number of lamps in each zone. The SCRs 108 can be controlled using either voltages or currents. While voltage control will preferably be used for SCRs 108 that are placed near the lamps, the current control (4–20 mA) will be required for remote installation of the SCRs 108. The SCRs 108 also have an electronic circuit which computes the power delivered into the lamps. This information is used by the temperature controller to optimized controller performance.

The SCRs 108 can be configured in a phase angle controlled full wave full converter configuration as illustrated in FIG. 18. The SCR configuration 124 uses two SCRs modules connected in series in each leg of a three phase full wave rectifier bridge.

Figure 19:
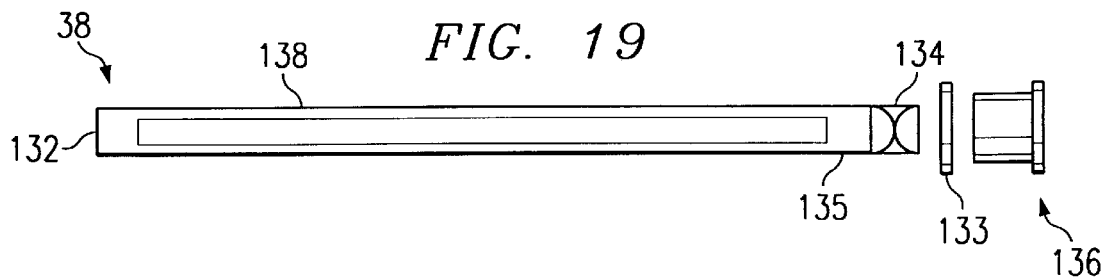
FIG. 19 shows an embodiment of the lightpipe assembly of the present invention.

FIG. 19 shows schematic diagram of an embodiment of a MultiProbe 37 used to take temperature measurements in the present invention. The multiprobe 37 comprises a lightpipe assembly 38 that includes a sapphire imaging lens 132, a lightpipe 138, a focusing lens 134, and a detector assembly 136. The imaging lens 132 images a point on the wafer roughly 0.5 cm in diameter. The radiation from the imaged point is coupled into the lightpipe 138 and is guided through the focusing lens 134 into the detector assembly 136.

The detector assembly 136 comprises an interference filter 135 at 3.3 μm, placed in front of a thermo-electrically cooled InAs detector 133. The temperature of the detector assembly 136 is maintained at about 0° C. through closed loop control. The detector signal is pre-amplified using low noise electronics. Both sides of the front imaging lens 132 and the rear focusing lens 134 as well as the faces of the fiber are coated with a broadband an anti-reflective coating with the wavelength corresponding to the sensitive range of the detector. The wavelength sensitivity of the system is determined by the interference filter 135 which is modular and easily replaced.

The lightpipe assembly 38 is first fabricated with hermetic seals on both ends of the lenses. Then a laser weld or e-beam weld is used to seal all metal components, and a small pump-out port (0.5 mm in diameter) is left in the assembly. The assembly is then placed in a vacuum chamber to establish vacuum within the probe assembly. A final e-beam weld is performed in vacuum to seal the lightpipe assembly 38.

Figure 20:
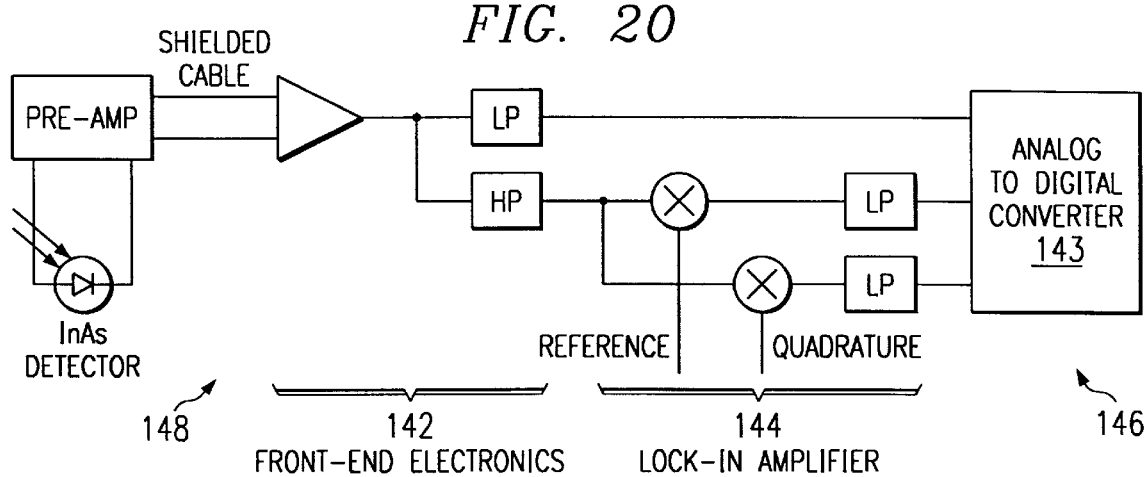
FIG. 20 is a diagram illustrating the electronics associated with the multicomp system.
Figure 21A:
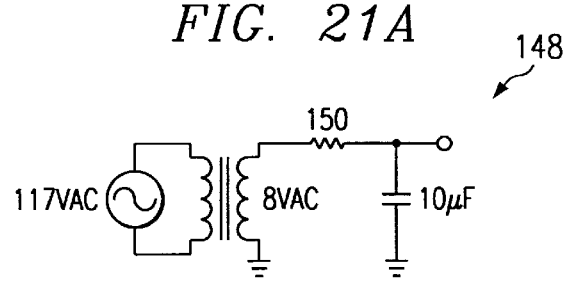
FIG. 21A shows an embodiment of a modulation circuit of the multicomp system electronics.
Figure 22:
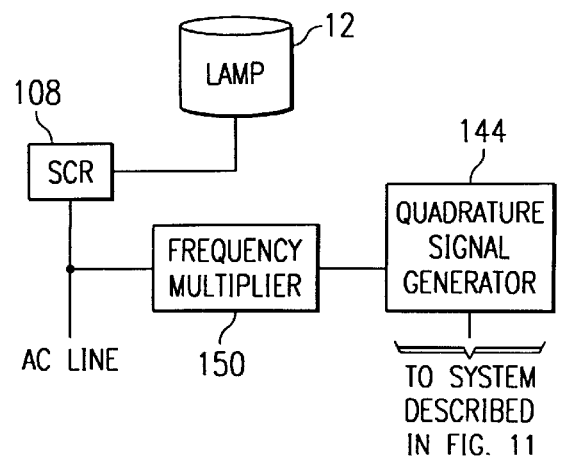
FIG. 22 shows a frequency multiplier circuit associated with the multicomp system electronics.
Figure 23:
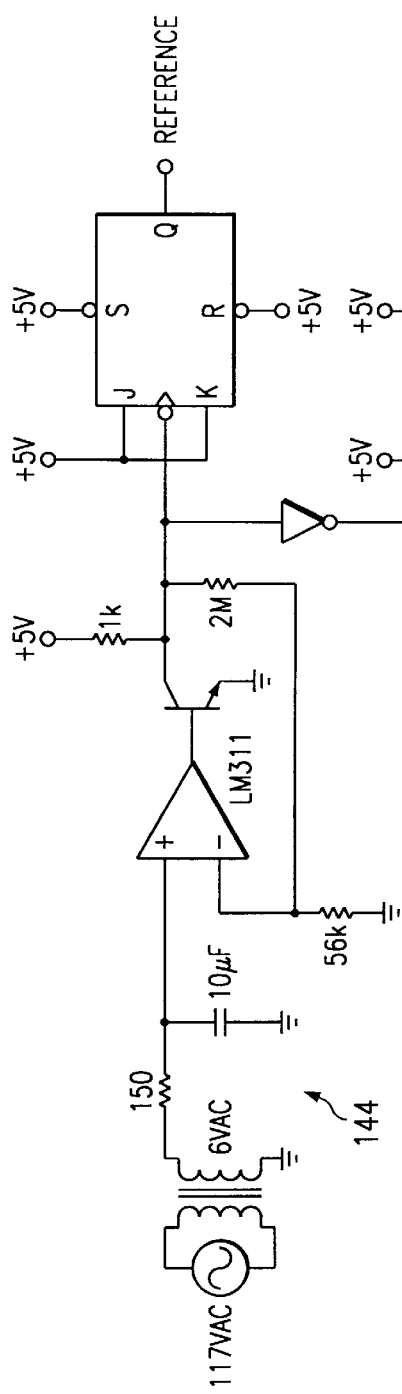
FIG. 23 shows a quadrature signal generator circuit associated with the multicomp system electronics.

FIG. 20 shows a schematic diagram of the electronics associated with the MultiComp that comprise a modulation circuit 148, the quadrature reference generator circuit 144, the front-end differential amplifier circuit 142, and the demodulation circuit 146. FIGS. 21A–21C illustrate various embodiments of modulation circuits 148 that take in a line voltage stepped down by a transformer and generates an AC signal which is a multiple of 30 Hz. The frequency multiplier of FIG. 22 takes the ac signal and produces a higher frequency signal phase-locked to the ac line signal. Both the phase and amplitude of the square wave modulating signal can be varied. A constant modulating signal is added to the dc lamp control signal. The lamp control signals are used to switch the SCRs that control the lamp intensity. The quadrature signal generator 144 shown in FIG. 23 takes the same reference line signal and produces two TTL level square waves 90° apart.

Figure 24:
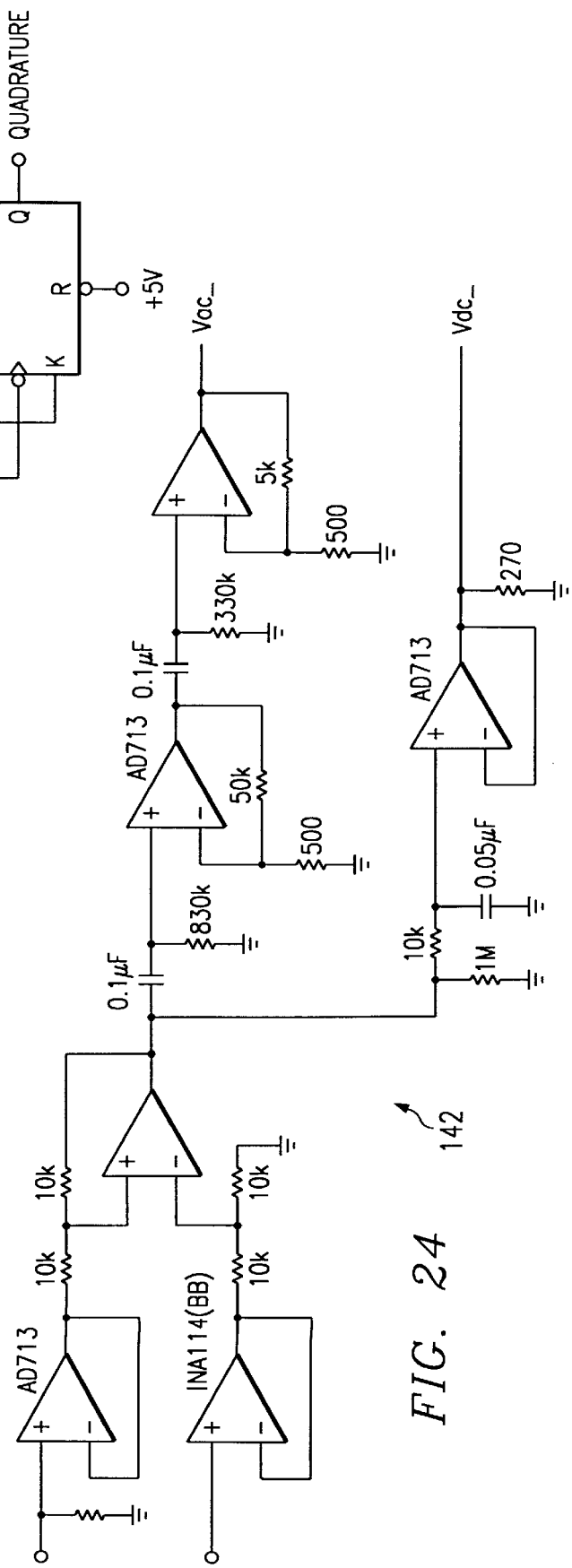
FIG. 24 shows an embodiment of the front end electronics associated with the present invention.
Figure 25:
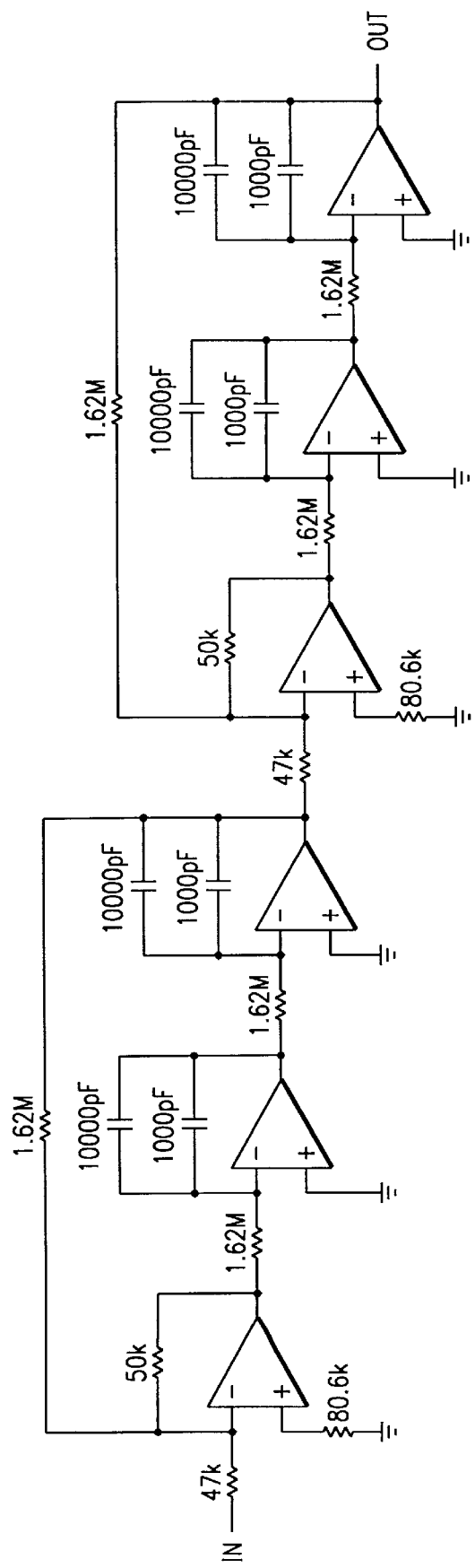
FIG. 25 shows a low pass filter circuit associated with the present invention.

The front-end differential amplifier 142 of FIG. 24 is the most critical electronic circuit in terms of maintaining high signal to noise. The output of the InAe detector is amplified differentially, eliminating common mode noise. The dc component of the detector signal (signals with frequencies less than 10 Hz) is simply buffered and connected to the A/D converter. The ac component of the signal (signals with frequencies larger than 5 Hz) is amplified 60 dB in two separate stages and is connected to the input of the demodulation circuit (implemented using AD630). The demodulation circuit takes the ac component of the detected signal (with a large 30 Hz) and demodulates it with the reference signal from the quadrature signal generator. The signal is then passed through a 4-pole Butterworth filter with a 9 Hz 3 dB point as shown in FIG. 25. The output of the filter provides the signal proportional to the amplitude of the modulated signal multiplied by the sine of the phase of the signal. An identical demodulation circuit demodulates the same signal using the quadrature signal as its reference. The output of this section of the circuit provides a signal proportional to the amplitude of the modulated signal multiplied by the cosine of the phase. The sine and cosine signals are applied to the A/D converter.

The analog to digital (A/D) converter 143 shown in FIG. 20 provides the following signals from the five lensed detectors and the five dummy lamp detectors at a data rate of 10 Hz:

DC component of the lensed detector ($S_i^{dc}$)

AC component of the lensed detector ($S_i^{ac} \sin \phi_{Si}$, $S_i^{ac} \cos \phi_{Si}$)

DC component of the dummy detector ($D_i^{dc}$)

AC component of the lensed detector ($D_i^{ac} \sin \phi_{Di}$, $D_i^{ac} \cos \phi_{Di}$)

i=1 . . . 5 corresponding to each of the five zones.

The multizone illuminator design of the present invention allows for five independently controllable zones in a five zone configuration. The present invention can employ five pyrometric detectors that measure the temperature of the wafer/SiC ring on five points corresponding to each of the five heating zones. Lenses are used to image the radiation emitted from the five detection points on the wafer/SiC ring. Although the detection of wafer radiation is localized within the point imaged by the lens, lamp radiation from any of the five zones can be scattered or reflected off the point. Thus, lamp interference detected by a particular sensor is a combination of the lamp radiation from the five zones. Because the lamp radiation in each of the five zones can be controlled independently, the relative lamp radiation contribution from each of the five zones must be measured and calibrated. The relative contribution of lamp radiation from zone i into detector j is termed $g_{ij}$ and is a function of the reactor and lamp assembly geometry. In terms of the lamp-detector interaction, the reactor can be described in full by a matrix G, containing the geometry factors, $g_{ij}$.

We thus define, G:

$$G = \begin{bmatrix} g_{11} & g_{12} & g_{13} & g_{14} & g_{15} \\ g_{21} & g_{22} & g_{23} & g_{24} & g_{25} \\ g_{31} & g_{32} & g_{33} & g_{34} & g_{35} \\ g_{41} & g_{42} & g_{43} & g_{44} & g_{45} \\ g_{51} & g_{52} & g_{53} & g_{54} & g_{55} \end{bmatrix} \quad (2)$$

The geometry factors are obtained during a calibration run one column at a time. In order to determine the geometry factors, the effect of lamp radiation in a particular zone on each of the five detectors need to be measured. This can be done by turning on the lamps in one zone and measuring the relative signal at each of the detectors. Because this would result in unacceptable temperature non-uniformity in the wafer with resulting non-uniformities in regional reflectivity, a method based on modulation is used. In this method, the lamps in each zone is turned on to achieve uniform temperature across the wafer at about 650 C. One zone is then modulated, and the ac component in the four detectors are measured to obtain the relative susceptibility of the detectors to the given lamp zone. In obtaining the first column, $g_{11}$, for example, the lamps are held at a power setting to maintain a 650° C. wafer temperature in all four zones. Modulation is provided in zone one only, and the resulting ac components of radiation is detected in each of the four detectors. The contribution of lamp radiation in zone i to detector j is then the ratio of the amplitude of ac radiation in detectors divided by the amplitude of ac radiation from the lamps in zone i as monitored by the dummy lamp detector. Thus, $$g_{ij} = \frac{\sqrt{S_{aci}^2 \cos^2 \phi_{Si} + S_{aci}^2 \sin^2 \phi_{Si}}}{\sqrt{D_{acj}^2 \cos^2 \phi_{Dj} + D_{acj}^2 \sin^2 \phi_{Dj}}} = \frac{S_{aci}^2}{D_{acj}^2} \quad (3)$$

The MultiComp system provides a computer controlled automated sequence of lamp modulation. Voltage controlled FET switches on the MultiComp circuit modulates selected zones in sequence. The timing of the modulation sequence is determined by software and is designed to provide enough sample points to obtain reliable high-signal data.

The five zone lamp interference correction system can then be represented by the following system of equations:

$$S_{aci}\cos\phi_{Si} = \alpha_i \sum_{j=1}^{n} g_{ij} D_{acj} \cos\phi_{Dj} \qquad (4)$$

$$S_{aci}\sin\phi_{Si} = \alpha_i \sum_{j=1}^{n} g_{ij} D_{acj} \sin\phi_{Dj} \qquad (5)$$

$$S_{dcj} = W_i + \alpha_i \sum_{j=1}^{n} g_{ij} D_{dcj} \qquad (6)$$

The $\alpha_i$ parameter are measurements of wafer reflectivity. The $W_i$ variables are the adjusted wafer radiance values.

In order to fully understand the significance of the various variables, an understanding the different component of radiation seen by each detector is required. The dummy detectors are placed in a controlled environment and thus sees radiation that can be separated into two components. One is the dc component of the lamp radiation ($D_i^{dc}$) and the other is the ac component of the lamp radiation ($D_i^{ac}$). The radiation detected by the lensed detectors, however, can be separated into many components. For the detector in zone i, there are the dc component of radiation from zones j=1 to 5. The level of the detected signal are dependent on three factors 1.) The intensity of the lamp radiation (proportional to $D_j$), 2.) The geometry factor which is the relative efficiency of radiation channeled from zone j to detector i, ($g_{ij}$) and 3.) the temperature dependent wafer reflectivity affecting detector in zone i ($\alpha_i$).

In order to model the radiation dynamics of the RTP chamber with the system of 15 equations, the following assumptions need to be made:

1.) Since the power delivered to dummy lamp i is identical to the power delivered in lamps in zone i, the radiation emitted from dummy lamp i is assumed to be proportional to the radiation emitted from zone i;

2.) Since the thermal time constants of the silicon wafer is much larger than 1/30 sec, the 30 Hz ac component radiation detected by both the dummy and lensed detectors are assumed to be proportional to the level of radiation from lamp radiation only;

3.) The geometry parameters $g_{ij}$ are assumed to be a function of the chamber and wafer geometry and is assumed to be independent of temperature (changes due to wafer reflectivity is assigned to $\alpha_i$). In addition, the geometry parameters are assumed to be equal for both dc and ac components of lamp radiation; and 3.) The wafer reflectivity factors $\alpha_i$ are assumed to be equal for both the dc and ac component of the lamp radiation.

Wafer reflectivity parameter ($\alpha_i$) is obtained from equations 4 and 5. The overdetermined 8×5 system of equations is solved using least squares technique where $\alpha_i$ $$\alpha_i = \frac{S_{aci}\cos\phi_{Si} \sum_{j=1}^{n} g_{ij} D_{acj} \cos\phi_{Dj} + S_{aci}\sin\phi_{Si} \sum_{j=1}^{n} g_{ij} D_{acj} \sin\phi_{Dj}}{\left(\sum_{j=1}^{n} g_{ij} D_{acj} \cos\phi_{Dj}\right)^2 + \left(\sum_{j=1}^{n} g_{ij} D_{acj} \sin\phi_{Dj}\right)^2} \qquad (7)$$

The five $\alpha_i$ values computed above are proportional the reflectance values at the temperature measurement points. Given the values of $\alpha_i$, equation 6 is solved for the values of $W_i$.

$$W_i = S_{dci} - \alpha_i \sum_{j=1}^{n} g_{ij} D_{dcj} \qquad (8)$$

The $W_i$ variables represent the wafer radiance corrected for lamp interference.

Measurement of Wafer Temperature from Corrected Wafer Radiance

Figure 15:
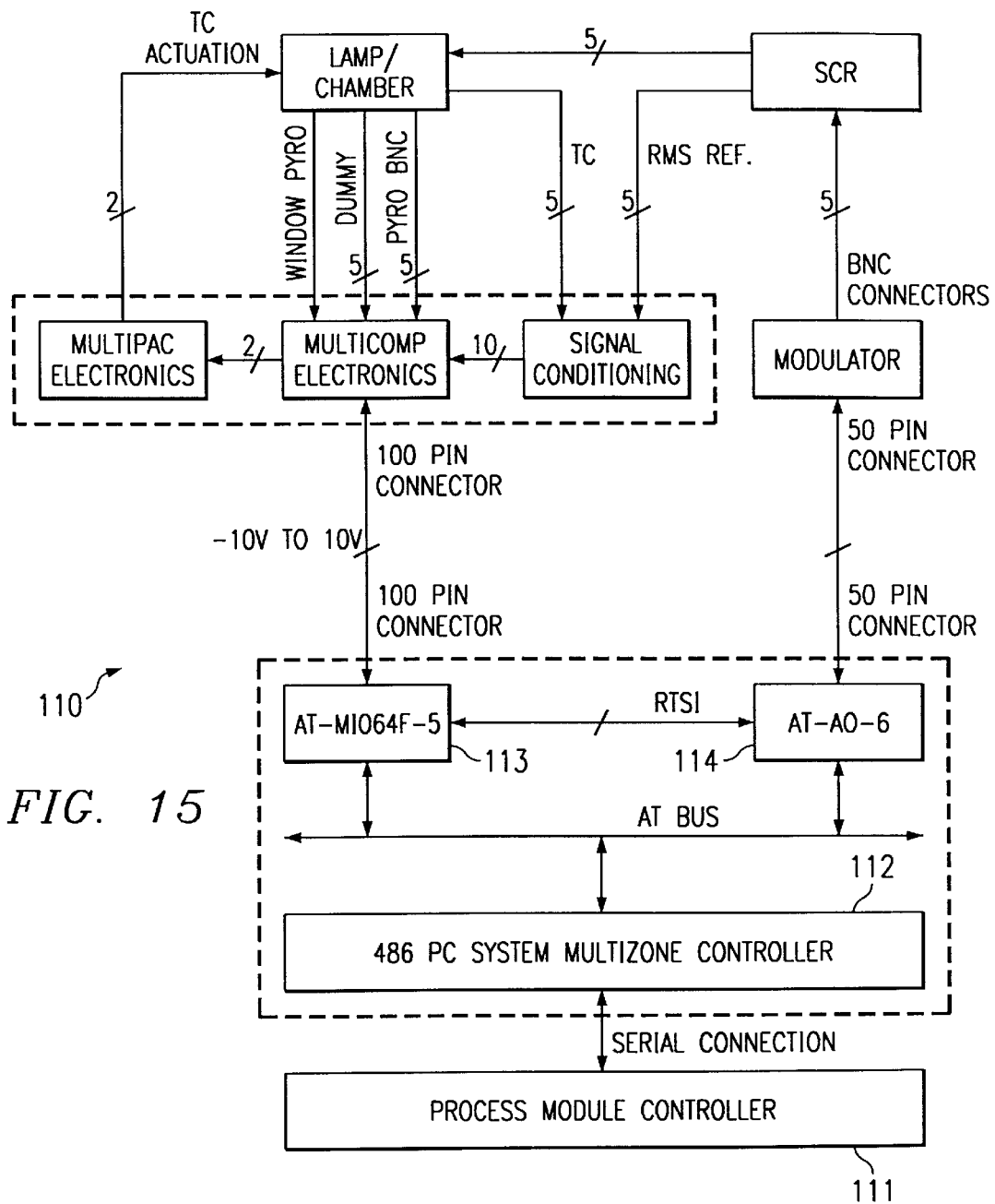
FIG. 15 is a block diagram illustrating the temperature measurement and control architecture of an embodiment of the present invention.

Having obtained the lamp interference corrected wafer radiance, a lookup table relating wafer temperature with corrected wafer radiance can be built by performing a calibration run with a thermocouple wafer. FIG. 15 illustrates the relationship between corrected wafer radiance and wafer temperature.

Reflectance Normalization

The $\alpha_i$ values are measures of localized wafer reflectivity scaled by the geometry parameters ($g_{ij}$). When the reflectivity of the wafer is zero, no radiation will be imaged by the tens and thus $\alpha_i$ will be zero. The $\alpha_i$ value will equal one when the wafer reflectivity is equal to the reflectivity at which the $g_{ij}$ parameters were taken. The theoretical maximum value of $\alpha_i$ will be reached when the wafer reflectance is one. Through this range $\alpha_i$ maintains linearity. Thus, one calibration point with a non-zero wafer reflectivity is needed to obtain the reflectance value $R_i$. This calibration point can be obtained by placing a wafer of known reflectivity at a given temperature when obtaining the geometry parameter. Given the known reflectivity $R_{cal}$ during the determination of the geometry parameters the wafer reflectance value ($R_i$) can be determined from the $\alpha_i$ values by computing $$R_i = R_{cal} \alpha_i \qquad (9)$$

Transmittance Values (if no reflective showerhead was present)

In order to compute emissivity from $ei=1-R_i-T_i$ the transmittance values are needed. The transmittance values can be obtained by applying the same techniques used to obtain the reflectance values. A lensed detector imaging a point on the opposite side of the wafer will detect the modulated component of the lamp radiation. This value will be normalized for the geometry factor at a known reference transmittance to obtain $T_i$ in a manner similar to the computation for $\alpha_i$.

Theoretical Analysis of Wafer Transmittance (without a reflective showerhead)

In order to analyze the wafer as an optical material, it is instructive to separate the interface effects from the bulk effects. Interface effects involve the reflection and transmission of optical waves at an index of refraction discontinuity. Interface effects include the interference effects of a system of thin films on the wafer where the transmission at the interface can be enhanced by impedance matching of different optical materials.

Bulk effect is essentially the attenuation of optical waves as it propagates through the silicon bulk due to interband absorption, intraband absorption, lattice vibrational absorption, and free-carrier absorption. For 3.3 $\mu$m, however, only the free-carrier absorption need to be considered. The photon energy at 3.3 $\mu$m is much smaller than the 0.66 eV bandgap reached when the wafer is at 1200C and lattice vibrational absorption is negligible for EM waves with wavelengths less than 6 $\mu$m.

In the analysis below, only the bulk effect is considered. The extent of attenuation of radiation as the wave propagates through the thickness of the wafer is computed. This values represents the maximum value of transmittance for a given wafer condition (i.e. wafer state and temperature). That is, the analysis computes the transmittance value when the reflectance at the surface of the wafer is zero.

The radiation intensity out of the opposite side of the wafer cm be computed as:

$$I = I_0 e^{-2ad}$$

$$I = I_0 e^{-2ad} \tag{10}$$

The ratio of the transmitted intensity to the initial intensity is the transmittance value assuming zero reflectance.

$$T_{max} = \frac{I}{I_0} = e^{-2ad} \tag{11}$$

$$T_{max} = \frac{I}{I_0} = e^{-2ad}$$

where $I_0$ is the intensity of radiation entering the wafer bulk, d is the thickness of the wafer, and a is the attenuation constraint. The attenuation constant a can be solved using classical theory as follows:

$$\alpha = \frac{2\pi k_d}{\lambda} \tag{12}$$

where kd is the extinction coefficient given by $$k_d = \frac{x}{2n_d} \tag{13}$$

$$x = \frac{1}{\omega}(g_0 a + g_h b) \tag{14}$$

$$a = \frac{q^2 n \mu c^2}{m_e(\omega^2 + g_e^2)} \tag{15}$$

$$b = \frac{q^2 p \mu c^2}{m_n(\omega^2 + g_h^2)} \tag{16}$$

In the above equations $\mu$ is the permeability of silicon, n and p are the electron and hole concentrations, $m_e$ and $m_h$ are the effective mass of electron and holes, and $g_e$ and $g_h$ are the damping constants of electrons and holes given by:

$$g_e = \frac{q}{\mu_n m_e} \tag{17}$$

$$g_h = \frac{q}{\mu_p m_h} \tag{18}$$

The index of refraction of doped silicon, $n_d$ is given by $$n_d = \sqrt{\frac{n_p^2 - a - b}{2} + \frac{1}{2}\sqrt{(n_p^2 - a - b)^2 + x^2}} \tag{19}$$

where $n_p$ is the index of refraction of pure silicon.

$$n_p = 3.45 + \frac{5.076 \times 10^{-4}}{\lambda}(T - 300) \tag{20}$$

where $\lambda$ is measured in $\mu$m.
The carrier mobilities are assumed to be independent of wavelength are given by $$\mu_n = \mu_{n(300K)} \left(\frac{T}{300}\right)^{-2.42} \tag{21}$$

$$\mu_p = \mu_{p(300K)} \left(\frac{T}{300}\right)^{-2.20} \tag{22}$$

where $\mu$n(300K) and $\mu$p(300K) are the electron and hole mobilities at 300K given by $$\mu_{n(300K)} = 92 + \frac{1268}{1 + \left(\frac{N_a + N_d}{1.3 \times 10^{17}}\right)^{0.91}} \tag{23}$$

$$\mu_{p(300K)} = 47.7 + \frac{447.3}{1 + \left(\frac{N_a + N_d}{6.3 \times 10^{16}}\right)^{0.76}} \tag{24}$$

where $N_a$ and $N_d$ are the acceptor and donor concentrations. The electron and hole concentrations are also assumed to be independent of wavelength and are given by $$n = \frac{N_d - N_a}{2} + \sqrt{\left(\frac{N_d - N_a}{2}\right)^2 + n_i^2} \tag{25}$$

$$p = \frac{N_a - N_d}{2} + \sqrt{\left(\frac{N_a - N_d}{2}\right)^2 + n_i^2} \tag{26}$$

Transmittance with highly reflective showerhead

When a highly reflective showerhead is introduced into the system, the effective transmittivity of the optical system created by the wafer and the showerhead becomes zero. That is, any radiation that is transmitted through the wafer is reflected off the showerhead and is redirected toward the wafer. The reflective showerhead thus has the effect of enhancing the reflectivity of the wafer-showerhead optical system compared to the wafer by itself.

With the highly reflective showerhead in place, the effective emissivity of the wafer-showerhead optical system is obtained simply by subtracting the reflectivity value from one. Assuming that the showerhead is perfectly reflective, we can conclude that the radiation which is absorbed by the wafer-showerhead optical system must be due completely to the wafer. Similarly, with the showerhead actively cooled, all radiation emanating from the wafer-showerhead system must be from the wafer. The effective emissivity of the wafer-showerhead system, rather than that of the wafer itself is the appropriate value to use for temperature measurement, as the thermal radiation detected by the pyrometer is that emanating from the wafer-showerhead system rather that from the wafer alone. The goal is emissivity compensation is to measure the emissivity changes in an environment identical to that used for temperature measurement. Because the pyrometer is affected by the emissivity of the wafer-showerhead system rather than that of the wafer alone, measurement and compensation of emissivity must be made for the wafer-showerhead system as well.

Computation of Real-Time Emissivity

Given the real-time reflectance ($R_i$) and transmittance ($T_i$), the emissivity can be obtained from Kirchoffs's law.

$$e_i = 1 - R_i - T_i \tag{27}$$

For heavily doped wafers such as the epi wafers used in the MMST microfactory, it can be shown that transmittance is negligible ($T_{max} < 1\%$) throughout the processing temperature range. Thus, for heavily doped epi wafers, the emissivity can be computed simply as $$e_i = 1 - R_i \quad (28)$$

Undoped wafers have negligible transmittance values ($T_{max} < 1\%$) above 600° C. Thus, to measure temperature above 600° C., equation 28 can also be used. When highly reflective showerhead is present, equation 28 can be used for all wafers at all temperature ranges.

Although the present invention has been described in detail, it should be understood that various changes, substitutions and alterations can be made hereto without departing from the spirit and scope of the invention as defined by the appended claims.

What is claimed is:

1. A system for rapid thermal processing of a substrate in a process chamber while measuring and controlling the temperature at the substrate to establish substantially uniform substrate temperature in real time, comprising:
   an axisymmetrical multi-zone illuminator, comprising:
      a plurality of substantially concentric rings of heating radiative lamps to direct optical power toward said substrate; and
      a gas showerhead facing a substrate frontside for gas delivery wherein the gas showerhead is an optical reflector, said optical reflector having substantially high optical reflectivity;
   a multi-zone temperature measurement system, comprising:
      a plurality of pyrometry sensors coupled to said multi-zone illuminator to measure the substrate radiance; and
      a system for real-time measurement and compensation of substrate emissivity and illuminator lamp light interference effects;
   a multi-variable temperature controller for providing multi-zone real-time temperature control; and
   a plurality of illuminator lamp power supplies.

2. The system of claim 1, wherein the optical reflector reflects a portion of the radiance transmitted through the substrate backside to the substrate frontside.

3. The system of claim 2, wherein the gas showerhead is fluid cooled.

4. A method for rapid thermal processing of a substrate in a process chamber while measuring and controlling the temperature at the substrate to establish a substantially uniform substrate temperature in real time, comprising:
   multi-zone illumination of a backside of said substrate comprising:
      driving a multi-zone illuminator facing the substrate backside with a plurality of electrical power supplies;
      delivering a gas via a gas showerhead facing the substrate frontside wherein the gas showerhead is an optical reflector; and
      reflecting radiance transmitted through the wafer to the wafer frontside using said optical reflector having substantially high optical reflectivity;
   multi-zone measurement of said substrate temperature using a multizone temperature measurement system, comprising:
      measuring said substrate radiance at a plurality of regions using a plurality of pyrometry sensors, wherein each of said pyrometry sensors measures one of said regions;
      measuring emissivity of said substrate at a portion of said plurality of regions;
      compensating for substrate emissivity effects in real time;
      measuring lamp light interference components in said plurality of pyrometry sensors due to said multizone illumination;
      correcting lamp light interference effects in said plurality of pyrometry sensors in real time; and
      obtaining a substantially accurate temperature distribution of said substrate corresponding to the portion of said plurality of regions in real time; and
   controlling said substrate temperature in real time using a multivariable temperature controller for controlling a plurality of multichannel power supplies, comprising:
      providing a set point temperature trajectory to said controller;
      providing a plurality of compensated and corrected pyrometry sensor signals to said controller; and
      controlling said multichannel power supplies to establish a substantially uniform thermal cycle corresponding to said temperature trajectory.

5. The method of claim 4, wherein reflecting radiance transmitted through the substrate to the substrate frontside using an optical reflector further comprises reflecting a portion of the radiance transmitted through the substrate backside to the substrate frontside.

6. The method of claim 4, wherein the gas showerhead is fluid cooled.

7. The method of claim 4, wherein measuring substrate emissivity effects further comprises measuring substrate reflectance and transmittance.

8. The method of claim 4, wherein measuring substrate emissivity further comprises measuring reflectance and subtracting the reflectance value from one to obtain an effective emissivity when using a highly reflective optical reflector.

9. A system for rapid thermal processing of a substrate in a process chamber while measuring and controlling the temperature at the substrate to establish substantially uniform substrate temperature in real time, comprising:
   an axisymmetrical multi-zone illuminator, comprising:
      a plurality of substantially concentric rings of heating radiative lamps to direct optical power toward said substrate; and
      an optical reflector having substantially high optical reflectivity wherein said optical reflector is a reflective showerhead for gas delivery, said optical reflector facing a frontside of the substrate;
   a multizone temperature measurement system, comprising:
      a plurality of pyrometry sensors coupled to said multi-zone illuminator to measure the substrate radiance; and
      a system for real-time measurement and compensation of substrate emissivity and illuminator lamp light interference effects;
   a multi-variable temperature controller for providing multi-zone real-time temperature control; and
   a plurality of illuminator lamp power supplies.

10. A system for rapid thermal processing of a substrate in a process chamber while measuring and controlling the temperature at the substrate to establish substantially uniform substrate temperature in real time, comprising:
   an axisymmetrical multi-zone illuminator, comprising:
      a plurality of substantially concentric rings of heating radiative lamps to direct optical power toward said substrate; and
      an optical reflector having substantially high optical reflectivity wherein the optical reflector drives the effective frontside emissivity towards 1, said optical reflector facing a frontside of the substrate;

a multizone temperature measurement system, comprising:
 a plurality of pyrometry sensors coupled to said multizone illuminator to measure the substrate radiance; and
 a system for real-time measurement and compensation of substrate emissivity and illuminator lamp light interference effects;

a multi-variable temperature controller for providing multi-zone real-time temperature control; and a plurality of illuminator lamp power supplies.

11. A method for rapid thermal processing of a substrate in a process chamber while measuring and controlling the temperature at the substrate to establish a substantially uniform substrate temperature in real time, comprising:

multizone illumination of a backside of said substrate comprising:
 driving a multizone illuminator facing the substrate backside with a plurality of electrical power supplies; and
 reflecting radiance transmitted through the substrate to the substrate frontside using an optical reflector having substantially high optical reflectivity wherein the effective substrate frontside emissivity is driven towards 1, said optical reflector facing the substrate frontside;

multizone measurement of said substrate temperature using a multizone temperature measurement system, comprising:
 measuring said substrate radiance at a plurality of regions using a plurality of pyrometry sensors, wherein each of said pyrometry sensors measures one of said regions;
 measuring emissivity of said substrate at a portion of said plurality of regions;
 compensating for substrate emissivity effects in real time;
 measuring lamp light interference components in said plurality of pyrometry sensors due to said multizone illumination;
 correcting lamp light interference effects in said plurality of pyrometry sensors in real time; and
 obtaining a substantially accurate temperature distribution of said substrate corresponding to the portion of said plurality of regions in real time; and controlling said substrate temperature in real time using a multivarialble temperature controller for controlling a plurality of multichannel power supplies, comprising:
 providing a set point temperature trajectory to said controller;
 providing a plurality of compensated and corrected pyrometry sensor signals to said controller; and
 controlling said multichannel power supplies to establish a substantially uniform thermal cycle corresponding to said temperature trajectory.

12. A multizone temperature measurement and compensation system for use with a multizone illuminator in a rapid thermal processing environment, comprising:

a plurality of pyrometry sensors coupled to the multi-zone illuminator to measure radiance at a plurality of regions on a backside of the substrate;

a highly reflective optical reflector facing a frontside of the substrate;

a system for real-time measurement and compensation of substrate emissivity wherein the system for measurement and compensation of substrate emissivity further comprises:
 a measuring means for measuring reflectance;
 driving the effective frontside emissivity towards 1; and
 a compensation means for subtracting the reflectance value from one to obtain an effective emissivity; and a system for real time measurement and correction of illuminator lamp light interference effects on the plurality of pyrometry sensors.

13. The system of claim 12, wherein the system for measurement and compensation for substrate emissivity further comprises a system that measures substrate reflectance and transmittance.

14. An axisymmetrical multi-zone illuminator system for use in rapid thermal processing of a substrate in a process chamber, comprising:

a lamp housing;

a plurality of substantially concentric rings of heating radiative lamps embedded within the lamp housing facing the substrate for generating and directing optical power toward a backside of the substrate; and an optical reflector having substantially high optical reflectivity facing a frontside of the substrate for radiating optical energy transmitted through the substrate backside toward the substrate frontside, said optical reflector driving the effective frontside emissivity towards 1.

15. The system of claim 14, wherein the optical reflector reflects a portion of the radiance transmitted through the substrate backside to the substrate frontside.

16. The system of claim 14, further comprising a gas showerhead facing the substrate frontside for gas delivery wherein the gas showerhead is the optical reflector.

17. The system of claim 14, wherein the gas showerhead is fluid cooled.

* * * * *